United States Patent
Kim et al.

(10) Patent No.: US 11,236,246 B2
(45) Date of Patent: Feb. 1, 2022

(54) INK COMPOSITION, ORGANIC LIGHT-EMITTING ELEMENT USING SAME, AND FABRICATION METHOD THEREOF

(71) Applicant: LG Chem, Ltd., Seoul (KR)

(72) Inventors: Mi Kyoung Kim, Daejeon (KR); Ji Young Jung, Daejeon (KR)

(73) Assignee: LG Chem, Ltd.

(*) Notice: Subject to any disclaimer, the term of this patent is extended or adjusted under 35 U.S.C. 154(b) by 230 days.

(21) Appl. No.: 16/349,023

(22) PCT Filed: Apr. 25, 2018

(86) PCT No.: PCT/KR2018/004787
§ 371 (c)(1),
(2) Date: May 10, 2019

(87) PCT Pub. No.: WO2018/221860
PCT Pub. Date: Dec. 6, 2018

(65) Prior Publication Data
US 2019/0264053 A1  Aug. 29, 2019

(30) Foreign Application Priority Data
May 29, 2017 (KR) .......... 10-2017-0066039

(51) Int. Cl.
*C09D 11/36* (2014.01)
*C09D 11/38* (2014.01)
(Continued)

(52) U.S. Cl.
CPC ............ *C09D 11/36* (2013.01); *C09D 11/38* (2013.01); *C09K 11/06* (2013.01); *H01L 51/0005* (2013.01); *H01L 51/0059* (2013.01); *H01L 51/0072* (2013.01); *H01L 51/50* (2013.01); *H01L 51/5012* (2013.01);
(Continued)

(58) Field of Classification Search
USPC .......................................................... 523/160
See application file for complete search history.

(56) References Cited

U.S. PATENT DOCUMENTS 5,571,850 A * 11/1996 Ma .................... C07C 69/604
106/31.75
2005/0221124 A1  10/2005 Hwang et al.
(Continued)

FOREIGN PATENT DOCUMENTS

CN 102318100 A 1/2012
CN 102449799 A 5/2012
(Continued)

OTHER PUBLICATIONS

Computer-generated English-language translation of JP 2010-209248 A.*
(Continued)

Primary Examiner — Vu A Nguyen
(74) Attorney, Agent, or Firm — Lerner, David, Littenberg, Krumholz & Mentlik, LLP

(57) ABSTRACT

The present specification relates to an ink composition comprising a solvent comprising one or more types of Chemical Formulae 1 to 4; and a charge transferring material or a light emitting material, an organic light emitting device using the same, and a method for manufacturing the same.

13 Claims, 1 Drawing Sheet

(51) Int. Cl.
  *C09K 11/06* (2006.01)
  *H01L 51/00* (2006.01)
  *H01L 51/50* (2006.01)
  *H01L 51/56* (2006.01)

(52) U.S. Cl.
  CPC .......... *H01L 51/56* (2013.01); *H01L 51/5056* (2013.01); *H01L 51/5072* (2013.01)

(56) References Cited

U.S. PATENT DOCUMENTS

| | | | |
|---|---|---|---|
| 2010/0200841 | A1 | 8/2010 | Cheon et al. |
| 2011/0057151 | A1 | 3/2011 | Chen et al. |
| 2011/0253990 | A1 | 10/2011 | Ishikawa et al. |
| 2012/0074360 | A1 | 3/2012 | Funyuu et al. |
| 2012/0205637 | A1 | 8/2012 | Cheon et al. |
| 2012/0273736 | A1 | 11/2012 | James et al. |
| 2018/0346748 | A1 | 12/2018 | Pan et al. |
| 2018/0354933 | A1 | 12/2018 | Bae et al. |
| 2019/0084920 | A1 | 3/2019 | Otani et al. |

FOREIGN PATENT DOCUMENTS

| | | | | |
|---|---|---|---|---|
| CN | 102782083 | A | | 11/2012 |
| EP | 3053910 | A1 | | 8/2016 |
| EP | 3434666 | A1 | | 1/2019 |
| JP | 2010209248 | A | * | 9/2010 ............... C09B 1/00 |
| JP | 2010209248 | A | | 9/2010 |
| JP | 2015191941 | A | | 11/2015 |
| JP | 2015533118 | A | | 11/2015 |
| JP | 2016156016 | A | | 9/2016 |
| KR | 20060059613 | A | | 6/2006 |
| KR | 20100008947 | A | | 1/2010 |
| KR | 20110086940 | A | | 8/2011 |
| KR | 20110138338 | A | | 12/2011 |
| KR | 20120061503 | A | | 6/2012 |
| KR | 20150093995 | A | | 8/2015 |
| KR | 20150093995 | A | * | 8/2015 |
| KR | 20170063363 | A | | 6/2017 |
| WO | 2017080307 | A1 | | 5/2017 |
| WO | 2017095141 | A1 | | 6/2017 |
| WO | 2017164158 | A1 | | 9/2017 |

OTHER PUBLICATIONS

Computer-generated English-language translation of KR-20150093995-A.*
Supplementary European Search Report including Written Opinion for Application No. EP18808768 dated Mar. 19, 2020.
International Search Report for PCT/KR2018/004787 dated Aug. 9, 2018.
Lengvinaite S, Grazulevicius JV, Grigalevicius S, Zhang B, Xie Z. "Carbazol-3-yl Substituted Aromatic Amines Containing Crosslinkable Groups as Materials for Multilayer Light Emitting Diodes." Molecular Crystals and Liquid Crystals. Dec. 3, 2008;497(1):164-172.
Partial Supplementary European Sarch Report including Written Opinion for Application No. EP18808768.8 dated Nov. 20, 2019.
S. Lengvinaite et al., "Carbazol-3-yl Substituted Aromatic Amines Containing Crosslinkable Groups as Materials for Multilayer Light Emitting Diodes", Molecular Crystals and Liquid Crystals, Dec. 3, 2008, vol. 497, No. 1, pp. 164-172, XP055589608.
Chen, Yunzhi et al. Printing Materials Science, the First Edition, China Light Industry Press, Jun. 2011, ISBN: 978-7-5019-8253-0; p. 264-265.
Search Report from Office Action for Chinese Application No. 2018800043164 dated May 8, 2021; 3 pages.

* cited by examiner

| 701 |
|---|
| 601 |
| 501 |
| 401 |
| 301 |
| 201 |
| 101 |

INK COMPOSITION, ORGANIC LIGHT-EMITTING ELEMENT USING SAME, AND FABRICATION METHOD THEREOF

CROSS-REFERENCE TO RELATED APPLICATIONS

The present application is a national phase entry under 35 U.S.C. § 371 of International Application No. PCT/KR2018/004787 filed Apr. 25, 2018, which claims priority from Korean Patent Application No. 10-2017-0066039 filed May 29, 2017, all of which are incorporated herein by reference.

TECHNICAL FIELD

The present specification relates to an ink composition comprising a solvent containing a ketone group; and a charge transferring material or a light emitting material, and a method for manufacturing an organic light emitting device formed using the ink composition.

BACKGROUND ART

Attempts to manufacture an organic light emitting device through a solution process have been ongoing, and manufacturing an organic light emitting device using an inkjet printing process that is economical and stable has received attention as precise pattern formation has been required with minimizing material consumption, smaller devices or increased display resolution.

An ink composition used in an inkjet printing process needs to be stably discharged, needs to have no phase separation between a functional material such as a charge transfer material or a light emitting material and a solvent, and needs to form a uniform film when forming a film.

Ether-based solvents or hydrocarbon-based solvents having relatively low polarity have been much used in the ink composition in the art, and for example, solvents such as phenoxytoluene or cyclohexylbenzene have been used. However, using the above-mentioned solvent as a main solvent has had a limit in increasing a solid content of the ink due to low solubility for a functional material, which leads to a problem in that a process takes a long time, and a stable film is not able to be formed with phase separation occurring when drying. In addition, when a solvent has low solubility for a functional material, the amount of the functional material capable of being dissolved in the ink is limited, and in order to obtain a target thickness, the number of drops that need to be dropped on pixels increases, and as a result, it is difficult to obtain a flat profile, and a target thickness.

In addition, even when having high solubility for a functional material, a solvent used in an ink composition needs to have a high boiling point in order to prevent a problem of a nozzle unit being dried. For example, cyclohexanone is considered as a solvent having favorable solubility, but has a low boiling point, and therefore, is not suited in an inkjet process since a nozzle unit is dried when used in an ink composition.

Accordingly, development of an ink composition comprising a solvent having excellent solubility for functional materials and having a high boiling point has been required in the art.

DISCLOSURE

Technical Problem

The present specification is directed to providing an ink composition usable in an organic light emitting device, and a method for manufacturing an organic light emitting device using the same.

Technical Solution

One embodiment of the present specification provides an ink composition comprising a solvent comprising one or more types of the following Chemical Formulae 1 to 4; and a charge transferring material or a light emitting material.

[Chemical Formula 1]

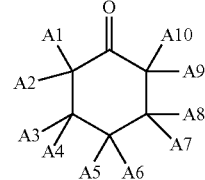

[Chemical Formula 2]

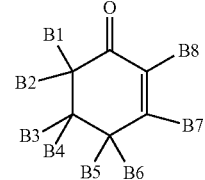

[Chemical Formula 3]

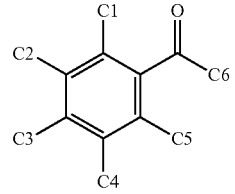

[Chemical Formula 4]

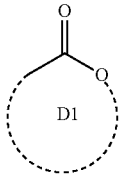

In Chemical Formulae 1 to 4,

A1 to A10 are the same as or different from each other, and each independently hydrogen; deuterium; a hydroxyl group; a carbonyl group; an ester group; a substituted or unsubstituted alkyl group; a substituted or unsubstituted cycloalkyl group; a substituted or unsubstituted cycloalkenyl group; a substituted or unsubstituted alkoxy group; a substituted or unsubstituted aryl group; or a substituted or unsubstituted amine group, and at least one of A1 to A10 is a hydroxyl group; a carbonyl group; an ester group; a substituted or unsubstituted alkyl group; a substituted or unsubstituted cycloalkyl group; a substituted or unsubstituted cycloalkenyl group; a substituted or unsubstituted alkoxy group; a substituted or unsubstituted aryl group; or a substituted or unsubstituted amine group, B1 to B8 are the same as or different from each other, and each independently hydrogen; deuterium; a hydroxyl group;

a carbonyl group; an ester group; a substituted or unsubstituted alkyl group; a substituted or unsubstituted cycloalkyl group; a substituted or unsubstituted cycloalkenyl group; a substituted or unsubstituted alkoxy group; a substituted or unsubstituted aryl group; or a substituted or unsubstituted amine group, C1 to C5 are the same as or different from each other, and each independently hydrogen; deuterium; a substituted or unsubstituted alkyl group; a substituted or unsubstituted cycloalkyl group; a substituted or unsubstituted cycloalkenyl group; a substituted or unsubstituted alkoxy group; or a substituted or unsubstituted aryl group, C6 is a substituted or unsubstituted alkyl group; a substituted or unsubstituted cycloalkyl group; a substituted or unsubstituted cycloalkenyl group; a substituted or unsubstituted alkoxy group; or a substituted or unsubstituted aryl group, and D1 is a substituted or unsubstituted aliphatic heterocyclic structure.

Another embodiment of the present specification provides a method for manufacturing an organic light emitting device comprising preparing a substrate; forming a cathode or an anode on the substrate; forming one or more organic material layers on the cathode or the anode; and forming an anode or a cathode on the organic material layers, wherein the forming of the organic material layers comprises forming one or more organic material layers using the ink composition.

Advantageous Effects

An ink composition according to one embodiment of the present specification has high solvent solubility for a functional material, and therefore, a content of the functional material can be increased in the ink composition, and as a result, an effect of shortening a process time is obtained since the number of ink drops can be reduced.

In addition, the ink composition of the present disclosure has a high boiling point, and functional material precipitation or phase separation when forming a film does not occur, and a uniform film can be formed since discharge can be stable.

DESCRIPTION OF DRAWINGS

The Figure illustrates an example of an organic light emitting device according to one embodiment of the present specification.
- 101: Substrate
- 201: Anode
- 301: Hole Injection Layer
- 401: Hole Transfer Layer
- 501: Light Emitting Layer
- 601: Electron Transfer Layer
- 701: Cathode

MODE FOR DISCLOSURE

Hereinafter, the present specification will be described in detail.

In the present specification, a description of one member being placed "on" another member comprises not only a case of the one member adjoining the another member but a case of still another member being present between the two members.

In the present specification, a description of a certain part "comprising" certain constituents means capable of further comprising other constituents, and does not exclude other constituents unless particularly stated on the contrary.

In the present specification, the term "combination thereof" included in a Markush-type expression means a mixture or a combination of one or more selected from the group consisting of constituents described in the Markush-type expression, and means comprising one or more selected from the group consisting of the constituents.

In the present specification, "a crosslinkable functional group" may mean a reactive substituent enabling crosslinking between compounds through an exposure to heat and/or light. The crosslinking may be produced by, through heat treatment or light irradiation, connecting radicals produced while carbon-carbon double bonds and cyclic structures are decomposed.

Hereinafter, substituents of the present specification will be described in detail.

In the present specification,

means a site bonding to other substituents or bonding sites.

In the present specification, the term "substitution" means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents may be the same as or different from each other.

The term "substituted or unsubstituted" in the present specification means being substituted with one or more substituents selected from the group consisting of deuterium; a nitrile group; a nitro group; a hydroxyl group; an alkyl group; an alkoxy group; an alkenyl group; an aryl group; an amine group; and a heterocyclic group, or being unsubstituted, or being substituted with a substituent linking two or more substituents among the substituents illustrated above, or being unsubstituted. For example, "a substituent linking two or more substituents" may comprise a biphenyl group. In other words, a biphenyl group may be an aryl group, or interpreted as a substituent linking two phenyl groups.

In the present specification, the alkyl group may be linear or branched, and according to one embodiment, the number of carbon atoms of the alkyl group is from 1 to 20. According to another embodiment, the number of carbon atoms of the alkyl group is from 1 to 10. According to another embodiment, the number of carbon atoms of the alkyl group is from 1 to 6. Specific examples of the alkyl group may comprise a methyl group, an isopropyl group, a pentyl group, a t-butyl group or the like, but are not limited thereto.

In the present specification, the alkoxy group may be linear, branched or cyclic. Although not particularly limited thereto, the number of carbon atoms of the alkoxy group may be from 1 to 20. Specifically, a methoxy group and the like may be included, however, the alkoxy group is not limited thereto.

The alkyl group, the alkoxy group and other substituents comprising an alkyl group part described in the present specification comprise both linear and branched forms.

In the present specification, the number of carbon atoms of the carbonyl group is not particularly limited, but is preferably from 1 to 20. Specifically, compounds having structures as below may be included, however, the carbonyl group is not limited thereto.

In the present specification, in the ester group, the oxygen of the ester group may be substituted with a linear, branched or cyclic alkyl group having 1 to 40 carbon atoms or an aryl group having 6 to 30 carbon atoms.

In the present specification, the cycloalkyl group is not particularly limited, however, according to one embodiment, the number of carbon atoms of the cycloalkyl group is from 3 to 20. According to another embodiment, the number of carbon atoms of the cycloalkyl group is from 3 to 6. Examples thereof may comprise a cyclohexyl group and the like, but are not limited thereto.

In the present specification, the cycloalkenyl group is not particularly limited, however, the number of carbon atoms is from 3 to 40. According to another embodiment, the number of carbon atoms of the cycloalkenyl group is from 3 to 20. Specific examples thereof may comprise a cyclohexenyl group and the like, but are not limited thereto.

In the present specification, the aryl group is not particularly limited, however, the number of carbon atoms may be from 6 to 40 or 6 to 20. The aryl group may be a monocyclic aryl group or a polycyclic aryl group. Examples of the aryl group may comprise a phenyl group and the like, but are not limited thereto.

In the present specification, a fluorenyl group may be substituted, and two substituents may bond to each other to form a spiro structure.

In the present specification, the number of carbon atoms of the amine group is not particularly limited, but is preferably from 1 to 30. The amine group may be substituted with the alkyl group, the aryl group, the heterocyclic group, the alkenyl group, the cycloalkyl group and a combination thereof described above.

In the present specification, the heterocyclic group is a heterocyclic group comprising one or more of N, O, P, S, Si and Se as a heteroatom, and although not particularly limited thereto, the number of carbon atoms is preferably from 1 to 60. According to one embodiment, the number of carbon atoms of the heterocyclic group is from 1 to 30.

In the present specification, descriptions on the heterocyclic group provided above may be applied to the heteroaryl group except for being aromatic.

In the present specification, the "adjacent" group may mean a substituent substituting an atom directly linked to an atom substituted by the corresponding substituent, a substituent sterically most closely positioned to the corresponding substituent, or another substituent substituting an atom substituted by the corresponding substituent. For example, two substituents substituting ortho positions in a benzene ring, and two substituents substituting the same carbon in an aliphatic ring may be interpreted as groups "adjacent" to each other.

In the present specification, the ring formed by adjacent groups bonding to each other may be monocyclic or polycyclic, may be aliphatic, aromatic or a fused ring of aromatic and aliphatic, and may form a hydrocarbon ring or a heteroring.

The hydrocarbon ring may be selected from among the examples of the cycloalkyl group or the aryl group except for those that are not monovalent. The heteroring may be aliphatic, aromatic or a fused ring of aromatic and aliphatic, and may be selected from among the examples of the heterocyclic group except for those that are not monovalent.

In the present specification, the arylene group may be selected from among the examples of the aryl group described above except for being divalent.

In one embodiment of the present specification, the ink composition comprises a solvent comprising one or more types of the following Chemical Formulae 1 to 4; and a charge transferring material or a light emitting material.

[Chemical Formula 1]

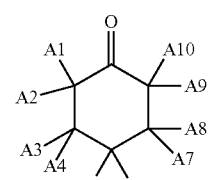

[Chemical Formula 2]

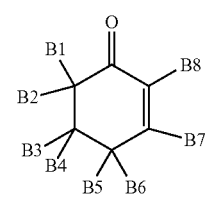

[Chemical Formula 3]

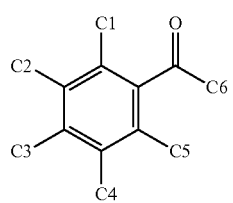

[Chemical Formula 4]

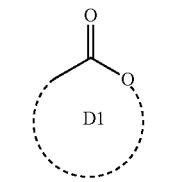

In Chemical Formulae 1 to 4,

A1 to A10 are the same as or different from each other, and each independently hydrogen; deuterium; a hydroxyl group; a carbonyl group; an ester group; a substituted or unsubstituted alkyl group; a substituted or unsubstituted cycloalkyl group; a substituted or unsubstituted cycloalkenyl group; a substituted or unsubstituted alkoxy group; a substituted or unsubstituted aryl group; or a substituted or unsubstituted amine group, and at least one of A1 to A10 is a hydroxyl group; a carbonyl group; an ester group; a substituted or unsubstituted alkyl group; a substituted or unsubstituted cycloalkyl group; a substituted or unsubstituted cycloalkenyl group; a substituted or unsubstituted alkoxy group; a substituted or unsubstituted aryl group; or a substituted or unsubstituted amine group, B1 to B8 are the same as or different from each other, and each independently hydrogen; deuterium; a hydroxyl group; a carbonyl group; an ester group; a substituted or unsubstituted alkyl group; a substituted or unsubstituted cycloalkyl group; a substituted or unsubstituted cycloalkenyl group; a substituted or unsubstituted alkoxy group; a substituted or unsubstituted aryl group; or a substituted or unsubstituted amine group, C1 to C5 are the same as or different from each other, and each independently hydrogen; deuterium; a substituted or unsubstituted alkyl group; a substituted or unsubstituted cycloalkyl group; a substituted or unsubstituted cycloalkenyl group; a substituted or unsubstituted alkoxy group; or a substituted or unsubstituted aryl group, C6 is a substituted or unsubstituted alkyl group; a substituted or unsubstituted cycloalkyl group; a substituted or unsubstituted cycloalkenyl group; a substituted or unsubstituted alkoxy group; or a substituted or unsubstituted aryl group, and D1 is a substituted or unsubstituted aliphatic heterocyclic structure.

In one embodiment of the present specification, A1 to A10 are the same as or different from each other, and each independently hydrogen; deuterium; a substituted or unsubstituted alkyl group; a substituted or unsubstituted cycloalkyl group; a substituted or unsubstituted cycloalkenyl group; or a substituted or unsubstituted aryl group, and at least one of A1 to A10 is a substituted or unsubstituted alkyl group; a substituted or unsubstituted cycloalkyl group; a substituted or unsubstituted cycloalkenyl group; or a substituted or unsubstituted aryl group.

In another embodiment, A1 to A10 are the same as or different from each other, and each independently hydrogen; deuterium; a substituted or unsubstituted alkyl group having 1 to 20 carbon atoms; a substituted or unsubstituted cycloalkyl group having 3 to 40 carbon atoms; a substituted or unsubstituted cycloalkenyl group having 3 to 40 carbon atoms; or a substituted or unsubstituted aryl group having 6 to 40 carbon atoms, and at least one of A1 to A10 is a substituted or unsubstituted alkyl group having 1 to 20 carbon atoms; a substituted or unsubstituted cycloalkyl group having 3 to 40 carbon atoms; a substituted or unsubstituted cycloalkenyl group having 3 to 40 carbon atoms; or a substituted or unsubstituted aryl group having 6 to 40 carbon atoms.

In another embodiment, A1 to A10 are the same as or different from each other, and each independently hydrogen; deuterium; a substituted or unsubstituted alkyl group having 1 to 10 carbon atoms; a substituted or unsubstituted cycloalkyl group having 3 to 20 carbon atoms; a substituted or unsubstituted cycloalkenyl group having 3 to 20 carbon atoms; or a substituted or unsubstituted aryl group having 6 to 20 carbon atoms, and at least one of A1 to A10 is a substituted or unsubstituted alkyl group having 1 to 10 carbon atoms; a substituted or unsubstituted cycloalkyl group having 3 to 20 carbon atoms; a substituted or unsubstituted cycloalkenyl group having 3 to 20 carbon atoms; or a substituted or unsubstituted aryl group having 6 to 20 carbon atoms.

According to another embodiment, A1 to A10 are the same as or different from each other, and each independently hydrogen; deuterium; a substituted or unsubstituted methyl group; a substituted or unsubstituted ethyl group; a substituted or unsubstituted propyl group; a substituted or unsubstituted isopropyl group; a substituted or unsubstituted butyl group; a substituted or unsubstituted t-butyl group; a substituted or unsubstituted pentyl group; a substituted or unsubstituted hexyl group; a substituted or unsubstituted cyclopropyl group; a substituted or unsubstituted cyclobutyl group; a substituted or unsubstituted cyclopentyl group; a substituted or unsubstituted cyclohexyl group; a substituted or unsubstituted cyclopropenyl group; a substituted or unsubstituted cyclobutenyl group; a substituted or unsubstituted cyclopentenyl group; a substituted or unsubstituted cyclohexenyl group; a substituted or unsubstituted phenyl group; a substituted or unsubstituted naphthyl group, and at least one of A1 to A10 is a substituted or unsubstituted methyl group; a substituted or unsubstituted ethyl group; a substituted or unsubstituted propyl group; a substituted or unsubstituted isopropyl group; a substituted or unsubstituted butyl group; a substituted or unsubstituted t-butyl group; a substituted or unsubstituted pentyl group; a substituted or unsubstituted hexyl group; a substituted or unsubstituted cyclopropyl group; a substituted or unsubstituted cyclobutyl group; a substituted or unsubstituted cyclopentyl group; a substituted or unsubstituted cyclohexyl group; a substituted or unsubstituted cyclopropenyl group; a substituted or unsubstituted cyclobutenyl group; a substituted or unsubstituted cyclopentenyl group; a substituted or unsubstituted cyclohexenyl group; a substituted or unsubstituted phenyl group; a substituted or unsubstituted biphenyl group; or a substituted or unsubstituted naphthyl group.

In another embodiment, A1 to A10 are the same as or different from each other, and each independently hydrogen; deuterium; a methyl group; an ethyl group; a propyl group; an isopropyl group; a substituted or unsubstituted butyl group; a t-butyl group; a pentyl group; a hexyl group; a cyclopropyl group unsubstituted or substituted with a methyl group; a cyclobutyl group unsubstituted or substituted with a methyl group; a cyclopentyl group unsubstituted or substituted with a methyl group; a cyclohexyl group unsubstituted or substituted with a methyl group; a cyclopropenyl group unsubstituted or substituted with a methyl group; a cyclobutenyl group unsubstituted or substituted with a methyl group; a cyclopentenyl group unsubstituted or substituted with a methyl group; a cyclohexenyl group unsubstituted or substituted with a methyl group; a phenyl group unsubstituted or substituted with a methyl group; a biphenyl group unsubstituted or substituted with a methyl group; or a naphthyl group unsubstituted or substituted with a methyl group, and at least one of A1 to A10 is a methyl group; an ethyl group; a propyl group; an isopropyl group; a substituted or unsubstituted butyl group; a t-butyl group; a pentyl group; a hexyl group; a cyclopropyl group unsubstituted or substituted with a methyl group; a cyclobutyl group unsubstituted or substituted with a methyl group; a cyclopentyl group unsubstituted or substituted with a methyl group; a cyclohexyl group unsubstituted or substituted with a methyl group; a cyclopropenyl group unsubstituted or substituted with a methyl group; a cyclobutenyl group unsubstituted or substituted with a methyl group; a cyclopentenyl group unsubstituted or substituted with a methyl group; a cyclohexenyl group unsubstituted or substituted with a methyl group; a phenyl group unsubstituted or substituted with a methyl group; a biphenyl group unsubstituted or substituted with a methyl group; or a naphthyl group unsubstituted or substituted with a methyl group.

In one embodiment of the present specification, Chemical Formula 1 may be any one of the following structures.

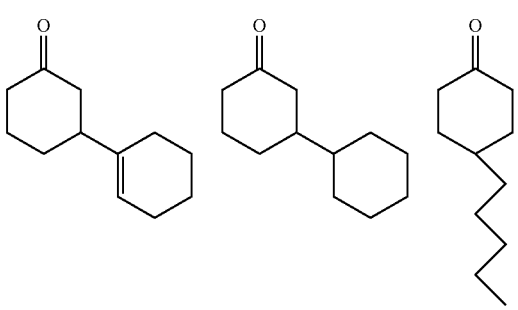

-continued

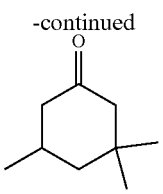

In one embodiment of the present specification, B1 to B8 are the same as or different from each other, and each independently hydrogen; deuterium; a substituted or unsubstituted alkyl group; a substituted or unsubstituted cycloalkyl group; a substituted or unsubstituted cycloalkenyl group; or a substituted or unsubstituted aryl group.

In another embodiment, B1 to B8 are the same as or different from each other, and each independently hydrogen; deuterium; a substituted or unsubstituted alkyl group having 1 to 20 carbon atoms; a substituted or unsubstituted cycloalkyl group having 3 to 40 carbon atoms; a substituted or unsubstituted cycloalkenyl group having 3 to 40 carbon atoms; or a substituted or unsubstituted aryl group having 6 to 40 carbon atoms.

According to another embodiment, B1 to B8 are the same as or different from each other, and each independently hydrogen; deuterium; a substituted or unsubstituted alkyl group having 1 to 10 carbon atoms; a substituted or unsubstituted cycloalkyl group having 3 to 20 carbon atoms; a substituted or unsubstituted cycloalkenyl group having 3 to 20 carbon atoms; or a substituted or unsubstituted aryl group having 6 to 20 carbon atoms.

In another embodiment, B1 to B8 are the same as or different from each other, and each independently hydrogen; deuterium; a substituted or unsubstituted methyl group; a substituted or unsubstituted ethyl group; a substituted or unsubstituted propyl group; a substituted or unsubstituted isopropyl group; a substituted or unsubstituted butyl group; a substituted or unsubstituted t-butyl group; a substituted or unsubstituted cyclopropyl group; a substituted or unsubstituted cyclobutyl group; a substituted or unsubstituted cyclopentyl group; a substituted or unsubstituted cyclohexyl group; a substituted or unsubstituted cyclopropenyl group; a substituted or unsubstituted cyclobutenyl group; a substituted or unsubstituted cyclopentenyl group; a substituted or unsubstituted cyclohexenyl group; a substituted or unsubstituted phenyl group; a substituted or unsubstituted biphenyl group; or a substituted or unsubstituted naphthyl group.

In another embodiment, B1 to B8 are the same as or different from each other, and each independently hydrogen; deuterium; a methyl group; an ethyl group; a propyl group; an isopropyl group; a substituted or unsubstituted butyl group; a t-butyl group; a cyclopropyl group; a cyclobutyl group; a cyclopentyl group; a cyclohexyl group; a cyclopropenyl group; a cyclobutenyl group; a cyclopentenyl group; a cyclohexenyl group; a phenyl group; a biphenyl group; or a naphthyl group.

In one embodiment of the present specification, Chemical Formula 2 may be any one of the following structures.

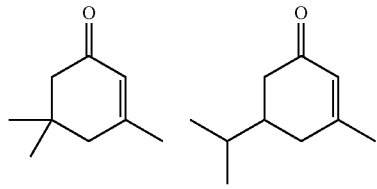

In one embodiment of the present specification, C1 to C5 are the same as or different from each other, and each independently hydrogen; deuterium; a substituted or unsubstituted alkyl group; or a substituted or unsubstituted alkoxy group.

In another embodiment, C1 to C5 are the same as or different from each other, and each independently hydrogen; deuterium; a substituted or unsubstituted alkyl group having 1 to 20 carbon atoms; or a substituted or unsubstituted alkoxy group having 1 to 20 carbon atoms.

According to another embodiment, C1 to C5 are the same as or different from each other, and each independently hydrogen; deuterium; a substituted or unsubstituted methyl group; a substituted or unsubstituted ethyl group; a substituted or unsubstituted propyl group; a substituted or unsubstituted isopropyl group; a substituted or unsubstituted butyl group; a substituted or unsubstituted t-butyl group; a substituted or unsubstituted pentyl group; a substituted or unsubstituted hexyl group; a substituted or unsubstituted methoxy group; a substituted or unsubstituted ethoxy group; a substituted or unsubstituted propoxy group; a substituted or unsubstituted butoxy group; a substituted or unsubstituted t-butoxy group; a substituted or unsubstituted pentyloxy group; or a substituted or unsubstituted hexyloxy group.

According to another embodiment, C1 to C5 are the same as or different from each other, and each independently hydrogen; deuterium; a methyl group; an ethyl group; a propyl group; an isopropyl group; a butyl group; a t-butyl group; a pentyl group; a hexyl group; a methoxy group; an ethoxy group; a propoxy group; a butoxy group; a t-butoxy group; a pentyloxy group; or a hexyloxy group.

In one embodiment of the present specification, C6 is a substituted or unsubstituted alkyl group; or a substituted or unsubstituted alkoxy group.

In another embodiment, C6 is a substituted or unsubstituted alkyl group having 1 to 20 carbon atoms; or a substituted or unsubstituted alkoxy group having 1 to 20 carbon atoms.

According to another embodiment, C6 is an alkyl group having 1 to 20 carbon atoms unsubstituted or substituted with an alkoxy group.

According to another embodiment, C6 is a methyl group unsubstituted or substituted with an alkoxy group; an ethyl group unsubstituted or substituted with an alkoxy group; a propyl group unsubstituted or substituted with an alkoxy group; a butyl group unsubstituted or substituted with an alkoxy group; a t-butyl group unsubstituted or substituted with an alkoxy group; a pentyl group unsubstituted or substituted with an alkoxy group; or a hexyl group unsubstituted or substituted with an alkoxy group.

According to another embodiment, C6 is a methyl group unsubstituted or substituted with an alkoxy group; an ethyl group unsubstituted or substituted with a methoxy group, an ethoxy group, a propoxy group, an isopropoxy group, a butoxy group or a t-butoxy group; a propyl group unsubstituted or substituted with a methoxy group, an ethoxy group, a propoxy group, an isopropoxy group, a butoxy group or a t-butoxy group; a butyl group unsubstituted or substituted with a methoxy group, an ethoxy group, a propoxy group, an isopropoxy group, a butoxy group or a t-butoxy group; a t-butyl group unsubstituted or substituted with a methoxy group, an ethoxy group, a propoxy group, an isopropoxy group, a butoxy group or a t-butoxy group; a pentyl group unsubstituted or substituted with a methoxy group, an ethoxy group, a propoxy group, an isopropoxy group, a butoxy group or a t-butoxy group; or a hexyl group unsubstituted or substituted with a methoxy group, an ethoxy group, a propoxy group, an isopropoxy group, a butoxy group or a t-butoxy group.

In one embodiment of the present specification, Chemical Formula 3 may be any one of the following structures.

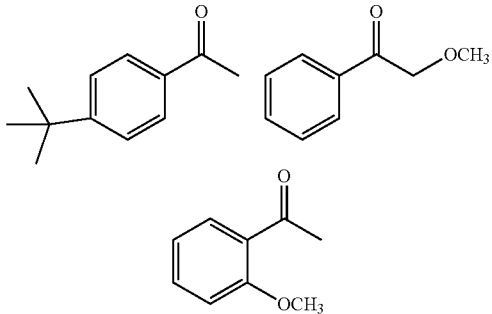

In one embodiment of the present specification, D1 is a substituted or unsubstituted aliphatic heterocyclic structure having 2 to 30 carbon atoms.

In another embodiment, D1 is a substituted or unsubstituted aliphatic heterocyclic structure having 2 to 20 carbon atoms.

According to another embodiment, D1 is an aliphatic heterocyclic structure having 2 to 20 carbon atoms unsubstituted or substituted with an alkyl group.

In another embodiment, D1 is an aliphatic heterocyclic structure having 2 to 20 carbon atoms unsubstituted or substituted with an alkyl group having 1 to 20 carbon atoms.

According to another embodiment, D1 is an aliphatic heterocyclic structure having 2 to 20 carbon atoms unsubstituted or substituted with a methyl group, an ethyl group, a propyl group, an isopropyl group, a butyl group, a tert-butyl group, a pentyl group, a hexyl group or a heptyl group.

In another embodiment, D1 is a trigonal to heptagonal aliphatic heterocyclic structure having 2 to 20 carbon atoms unsubstituted or substituted with a methyl group, an ethyl group, a propyl group, an isopropyl group, a butyl group, a tert-butyl group, a pentyl group, a hexyl group or a heptyl group.

In one embodiment of the present specification, Chemical Formula 4 may be any one of the following structures.

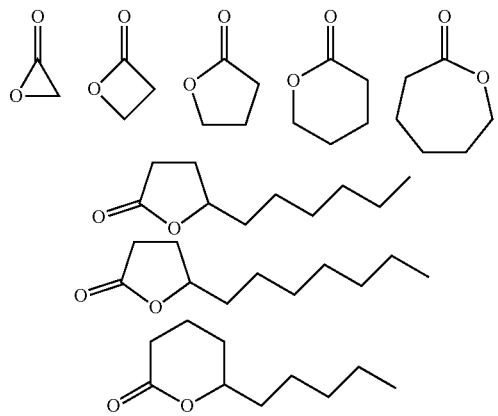

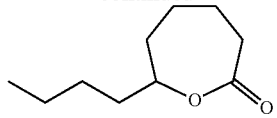

In one embodiment of the present specification, the charge transferring material or the light emitting material is represented by the following Chemical Formula 5.

[Chemical Formula 5]

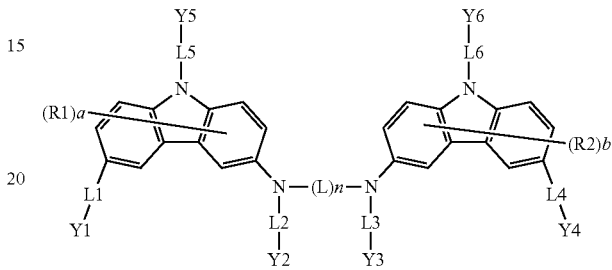

In Chemical Formula 5,

L is a substituted or unsubstituted arylene group; a substituted or unsubstituted divalent heterocyclic group; or -L7—NR'-L8-, L7 and L8 are the same as or different from each other and each independently a substituted or unsubstituted arylene group, and R' is a substituted or unsubstituted aryl group; or a substituted or unsubstituted heterocyclic group, L1 and L4 are the same as or different from each other, and each independently a direct bond; a substituted or unsubstituted arylene group; or a substituted or unsubstituted divalent heterocyclic group, L2 and L3 are the same as or different from each other, and each independently a direct bond; a substituted or unsubstituted alkylene group having 1 to 30 carbon atoms; a substituted or unsubstituted alkenylene group having 2 to 30 carbon atoms; a substituted or unsubstituted arylene group having 6 to 30 carbon atoms; or a substituted or unsubstituted divalent heterocyclic group having 2 to 30 carbon atoms, L5 and L6 are the same as or different from each other, and each independently a substituted or unsubstituted alkylene group having 1 to 30 carbon atoms; a substituted or unsubstituted alkenylene group having 2 to 30 carbon atoms; a substituted or unsubstituted arylene group having 6 to 30 carbon atoms; or a substituted or unsubstituted divalent heterocyclic group having 2 to 30 carbon atoms, a and b are each an integer of 1 to 6, when a and b are each 2 or greater, structures in the parentheses are the same as or different from each other, R1 and R2 are the same as or different from each other, and each independently hydrogen; deuterium; a substituted or unsubstituted alkyl group having 1 to 30 carbon atoms; a substituted or unsubstituted alkoxy group having 1 to 30 carbon atoms; a substituted or unsubstituted aryl group having 6 to 30 carbon atoms; a substituted or unsubstituted arylamine group; or a substituted or unsubstituted heterocyclic group having 2 to 30 carbon atoms, or adjacent substituents bond to each other to form a substituted or unsubstituted hydrocarbon ring; or a substituted or unsubstituted heterocyclic group, n is an integer of 1 to 4, when n is an integer of 2 or greater, 2 or more Ls are the same as or different from each other, and Y1 to Y6 are the same as or different from each other, and each independently hydrogen; or a functional group crosslinkable by heat or light, and at least one of Y1 to Y4 is a functional group crosslinkable by heat or light.

By comprising a solvent of one or more types of Chemical Formulae 1 to 4 and a charge transferring material or a light emitting material represented by Chemical Formula 5, the ink composition of the present disclosure is stably discharged from an inkjet head, does not cause problems that may be caused from solvent being dried since the boiling point is high, and may form a film having excellent film stability when manufacturing an organic light emitting device.

In one embodiment of the present specification, R1 and R2 are the same as or different from each other, and each independently hydrogen; deuterium; a substituted or unsubstituted alkyl group having 1 to 30 carbon atoms; or a substituted or unsubstituted aryl group having 6 to 30 carbon atoms.

In another embodiment, R1 and R2 are the same as or different from each other, and each independently hydrogen; deuterium; or a substituted or unsubstituted alkyl group having 1 to 30 carbon atoms.

In another embodiment, adjacent substituents among a plurality of R1 s bond to each other to form a substituted or unsubstituted hydrocarbon ring; or a substituted or unsubstituted heterocyclic group.

In one embodiment, adjacent substituents among a plurality of R1 s form a substituted or unsubstituted hydrocarbon ring.

In another embodiment, adjacent substituents among a plurality of R1 s form a substituted or unsubstituted hydrocarbon ring having 6 to 30 carbon atoms.

In another embodiment, adjacent substituents among a plurality of R1 s form a substituted or unsubstituted benzene ring.

In another embodiment, adjacent substituents among a plurality of R1 s form a benzene ring.

In another embodiment, adjacent substituents among a plurality of R2 s bond to each other to form a substituted or unsubstituted hydrocarbon ring; or a substituted or unsubstituted heterocyclic group.

In one embodiment, adjacent substituents among a plurality of R2 s form a substituted or unsubstituted hydrocarbon ring.

In another embodiment, adjacent substituents among a plurality of R2 s form a substituted or unsubstituted hydrocarbon ring having 6 to 30 carbon atoms.

In another embodiment, adjacent substituents among a plurality of R2 s form a substituted or unsubstituted benzene ring.

In another embodiment, adjacent substituents among a plurality of R2 s form a benzene ring.

In one embodiment of the present specification, R1 is hydrogen.

In another embodiment, R2 is hydrogen.

In one embodiment of the present specification, L1 and L4 are the same as or different from each other, and each independently a direct bond; a substituted or unsubstituted arylene group; or a substituted or unsubstituted divalent heterocyclic group.

In one embodiment of the present specification, L1 and L4 are the same as or different from each other, and each independently a direct bond; a substituted or unsubstituted arylene group having 6 to 30 carbon atoms; or a substituted or unsubstituted divalent heterocyclic group having 2 to 30 carbon atoms.

In one embodiment of the present specification, L1 and L4 are the same as or different from each other, and each independently a direct bond; or a substituted or unsubstituted arylene group having 6 to 30 carbon atoms.

In one embodiment of the present specification, L1 and L4 are the same as or different from each other, and each independently a direct bond; or a substituted or unsubstituted phenylene group.

In one embodiment of the present specification, L1 is a direct bond.

In another embodiment, L1 is a substituted or unsubstituted arylene group having 6 to 30 carbon atoms.

In another embodiment, L1 is a substituted or unsubstituted phenylene group.

In another embodiment, L1 is a phenylene group.

In one embodiment of the present specification, L4 is a direct bond.

In another embodiment, L4 is a substituted or unsubstituted arylene group having 6 to 30 carbon atoms.

In another embodiment, L4 is a substituted or unsubstituted phenylene group.

In another embodiment, L4 is a phenylene group.

In another embodiment, L2 and L3 are the same as or different from each other, and each independently a direct bond; a substituted or unsubstituted arylene group having 6 to 30 carbon atoms; or a substituted or unsubstituted heterocyclic group having 2 to 30 carbon atoms.

In one embodiment of the present specification, L2 and L3 are the same as or different from each other, and each independently a substituted or unsubstituted phenylene group; a substituted or unsubstituted biphenylene group; a substituted or unsubstituted naphthylene group; or a substituted or unsubstituted fluorenylene group.

In one embodiment of the present specification, L2 and L3 are a direct bond.

In another embodiment, L2 is a substituted or unsubstituted phenylene group.

In another embodiment, L2 is a phenylene group.

In one embodiment of the present specification, L2 is a phenylene group substituted with an alkyl group.

In one embodiment, L2 is a phenyl group substituted with an alkyl group having 1 to 20 carbon atoms.

In another embodiment, L2 is a phenyl group substituted with a methyl group.

In another embodiment, L2 is a substituted or unsubstituted biphenyl group.

In another embodiment, L2 is a biphenyl group.

In another embodiment, L2 is a substituted or unsubstituted naphthyl group.

In another embodiment, L2 is a naphthyl group.

In one embodiment of the present specification, L2 is a substituted or unsubstituted fluorenyl group.

In another embodiment, L2 is a fluorenyl group unsubstituted or substituted with an alkyl group.

In another embodiment, L2 is a fluorenyl group substituted with an alkyl group having 1 to 20 carbon atoms.

In another embodiment, L2 is a fluorenyl group substituted with a methyl group.

In one embodiment of the present specification, L3 is a substituted or unsubstituted aryl group.

In another embodiment, L3 is a substituted or unsubstituted aryl group having 6 to 30 carbon atoms.

In another embodiment, L3 is a substituted or unsubstituted phenyl group.

In another embodiment, L3 is a phenyl group.

In one embodiment of the present specification, L3 is a phenyl group substituted with an alkyl group.

In one embodiment, L3 is a phenyl group substituted with an alkyl group having 1 to 20 carbon atoms.

In another embodiment, L3 is a phenyl group substituted with a methyl group.

In another embodiment, L3 is a substituted or unsubstituted biphenyl group.

In another embodiment, L3 is a biphenyl group.

In another embodiment, L3 is a substituted or unsubstituted naphthyl group.

In another embodiment, L3 is a naphthyl group.

In one embodiment of the present specification, L3 is a substituted or unsubstituted fluorenyl group.

In another embodiment, L3 is a fluorenyl group unsubstituted or substituted with an alkyl group.

In another embodiment, L3 is a fluorenyl group substituted with an alkyl group having 1 to 20 carbon atoms.

In another embodiment, L3 is a fluorenyl group substituted with a methyl group.

In one embodiment of the present specification, L5 and L6 are the same as or different from each other, and each independently a substituted or unsubstituted arylene group having 6 to 30 carbon atoms.

According to one embodiment of the present specification, L5 and L6 are the same as or different from each other, and each independently a substituted or unsubstituted phenylene group.

In one embodiment of the present specification, n is 1.

In another embodiment, n is 2.

In one embodiment of the present specification, L is a substituted or unsubstituted arylene group; a substituted or unsubstituted divalent a heterocyclic group; or -L7—NR'-L8-.

In one embodiment of the present specification, L is a substituted or unsubstituted arylene group having 6 to 30 carbon atoms.

In another embodiment, L is a substituted or unsubstituted phenylene group; a substituted or unsubstituted biphenylene group; or a substituted or unsubstituted fluorenylene group.

In one embodiment of the present specification, L is a phenylene group.

In another embodiment, L is a biphenylylene group.

In another embodiment, L is a fluorenylene group substituted with an alkyl group.

In another embodiment, L is a fluorenylene group substituted with an alkyl group having 1 to 20 carbon atoms.

In one embodiment of the present specification, L is a fluorenylene group substituted with a methyl group.

In one embodiment of the present specification, L is a substituted or unsubstituted divalent heterocyclic group.

The present specification<sup>o</sup>] In one embodiment, L is a substituted or unsubstituted divalent heterocyclic group comprising one or more N atoms.

In another embodiment, L is a substituted or unsubstituted divalent heterocyclic group having 2 to 30 carbon atoms comprising one or more N atoms.

In one embodiment, L is a substituted or unsubstituted carbazolylene group.

In one embodiment of the present specification, L is a carbazolylene group unsubstituted or substituted with an aryl group having 6 to 30 carbon atoms.

In one embodiment, L is a carbazolylene group substituted with a phenyl group.

In one embodiment of the present specification, L is -L7—NR'-L8-.

In one embodiment of the present specification, L7 and L8 are the same as or different from each other, and each independently a substituted or unsubstituted arylene group having 6 to 30 carbon atoms.

In another embodiment, L7 and L8 are the same as or different from each other, and each independently a substituted or unsubstituted phenylene group.

In another embodiment, L7 and L8 are a phenylene group.

In one embodiment of the present specification, R' is a substituted or unsubstituted aryl group having 6 to 30 carbon atoms; or a substituted or unsubstituted heterocyclic group having 2 to 30 carbon atoms.

In one embodiment of the present specification, R' is a substituted or unsubstituted aryl group having 6 to 30 carbon atoms.

In another embodiment, R' is a substituted or unsubstituted phenyl group.

According to another embodiment, R' is a phenyl group.

In one embodiment of the present specification, Y1 to Y6 are the same as or different from each other, and each independently hydrogen; or a functional group crosslinkable by heat or light, and at least one of Y1 to Y4 is a functional group crosslinkable by heat or light.

In one embodiment of the present specification, Y1 to Y6 are the same as or different from each other, and each independently hydrogen; or any one of the following structures, and at least one of Y1 to Y4 is any one of the following structures.

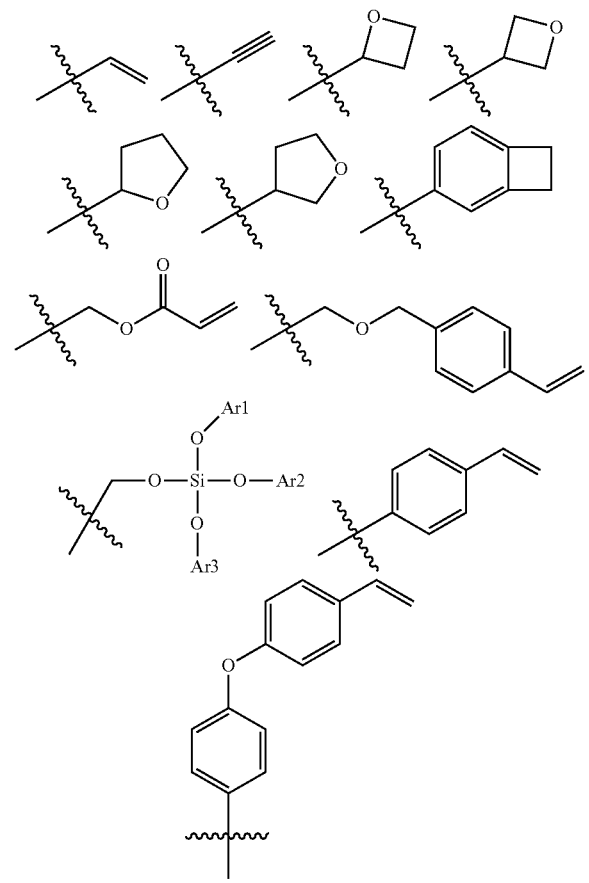

-continued

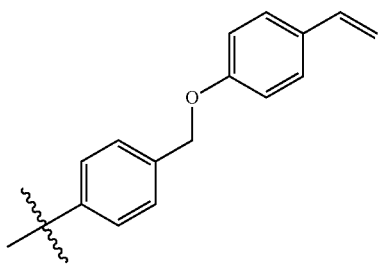

In the structures,

Ar1 to Ar3 are the same as or different from each other, and each independently a substituted or unsubstituted alkyl group having 1 to 6 carbon atoms.

With a carbazole derivative comprising a crosslinkable functional group as in one embodiment of the present specification, an organic light emitting device may be manufactured using a solution coating method, which is economically effective in terms of time and costs.

In one embodiment of the present specification, Chemical Formula 5 is represented by any one of the following Chemical Formulae 1-1 to 1-32.

Chemical Formula 1-1

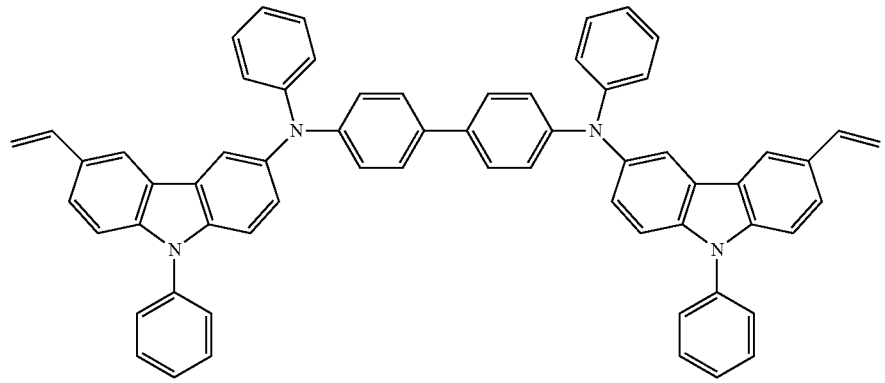

Chemical Formula 1-2

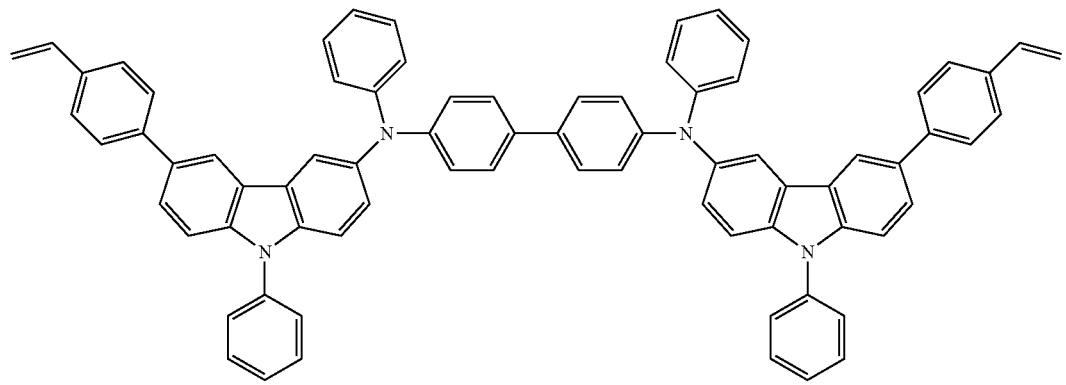

Chemical Formula 1-3

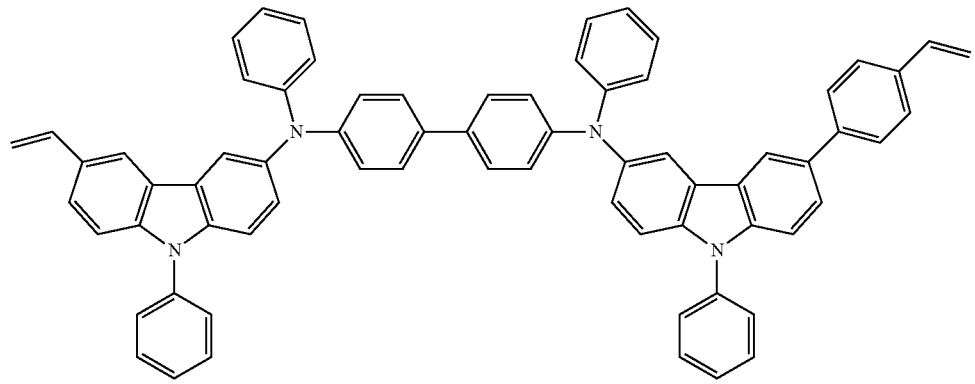

Chemical Formula 1-4
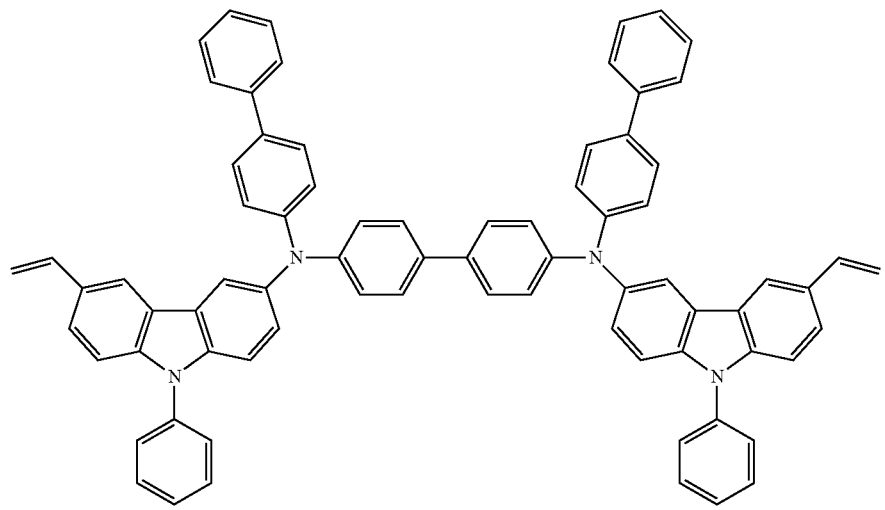
Chemical Formula 1-5
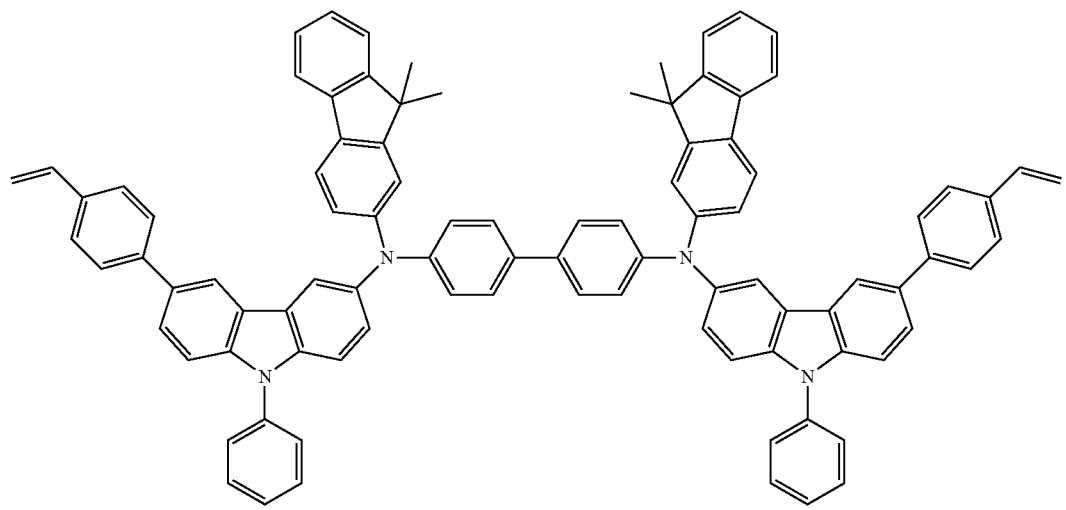
Chemical Formula 1-6
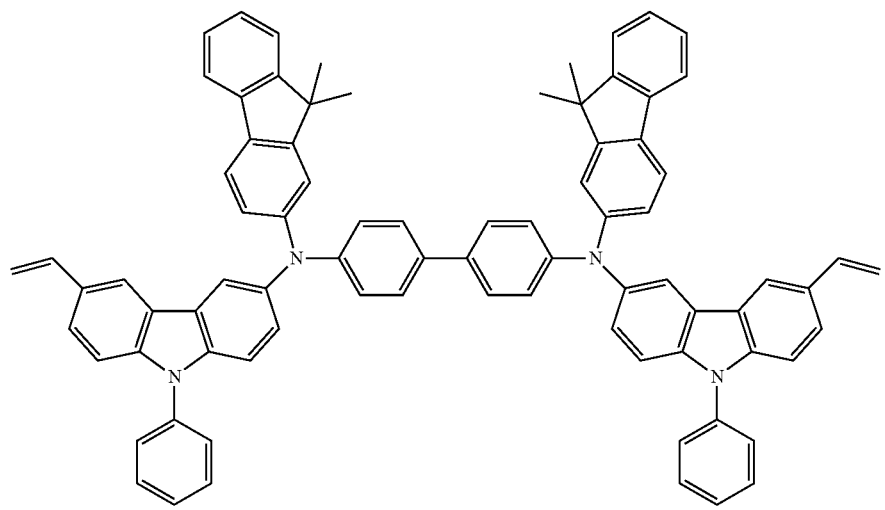

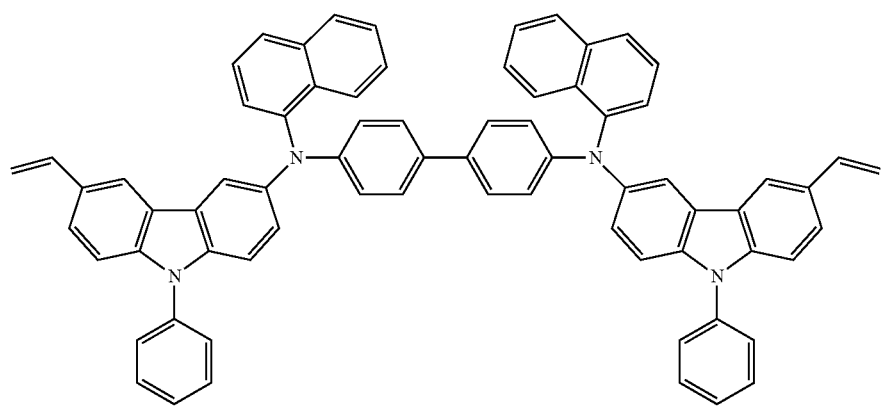
Chemical Formula 1-7
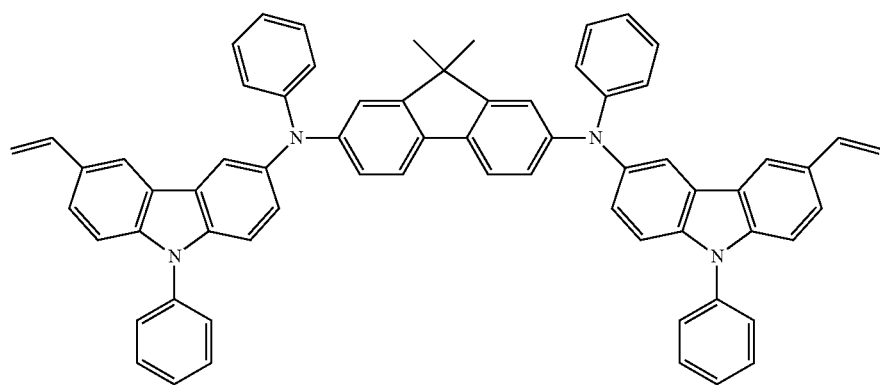
Chemical Formula 1-8
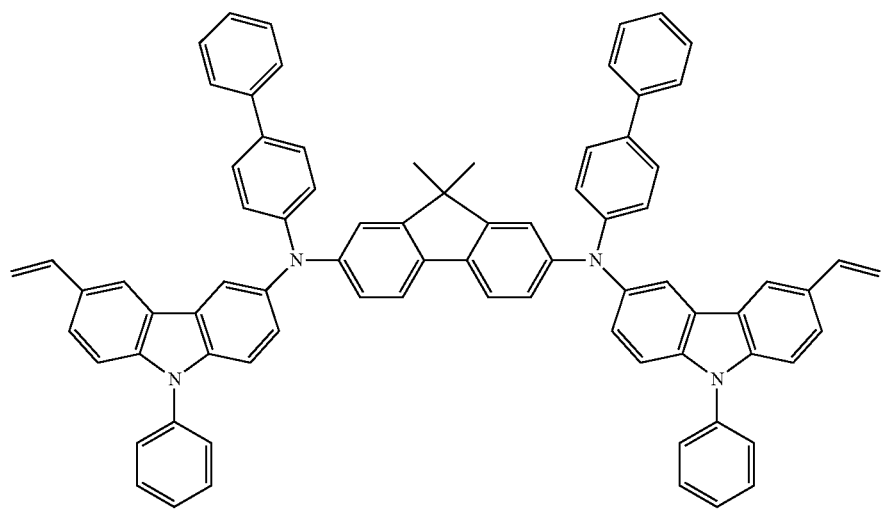
Chemical Formula 1-9

Chemical Formula 1-10
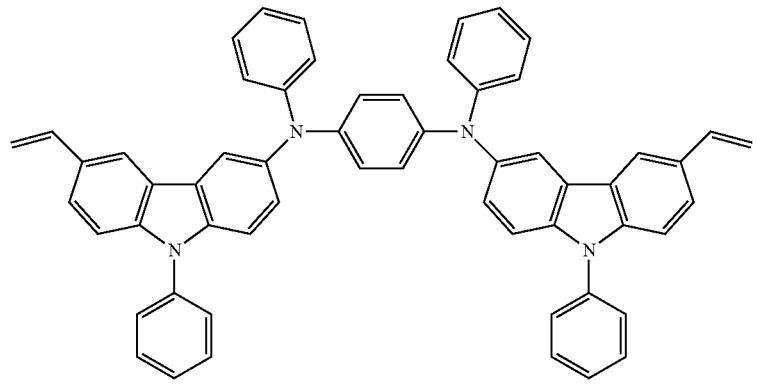
Chemical Formula 1-11
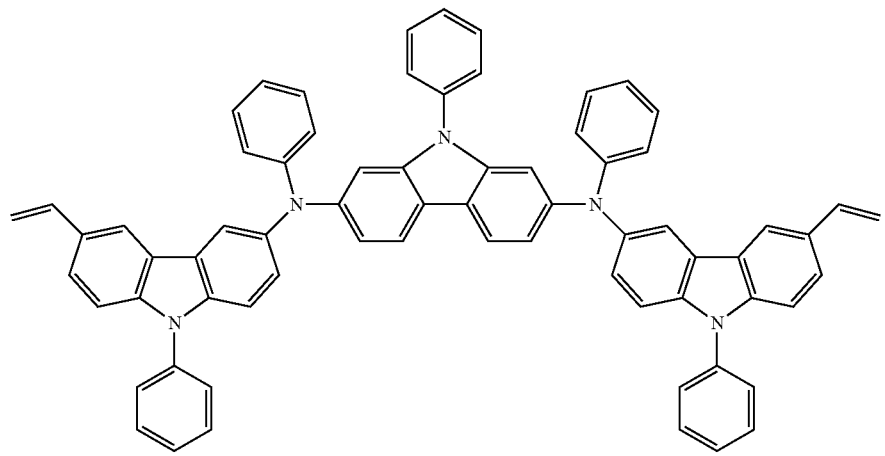
Chemical Formula 1-12
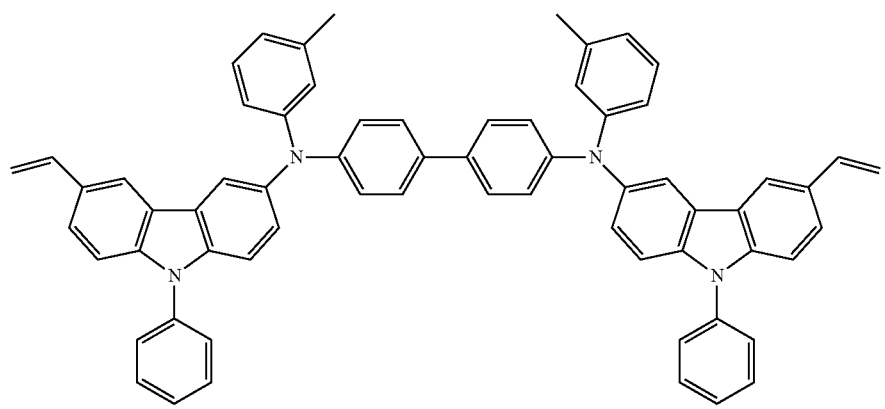
Chemical Formula 1-13             Chemical Formula 1-14
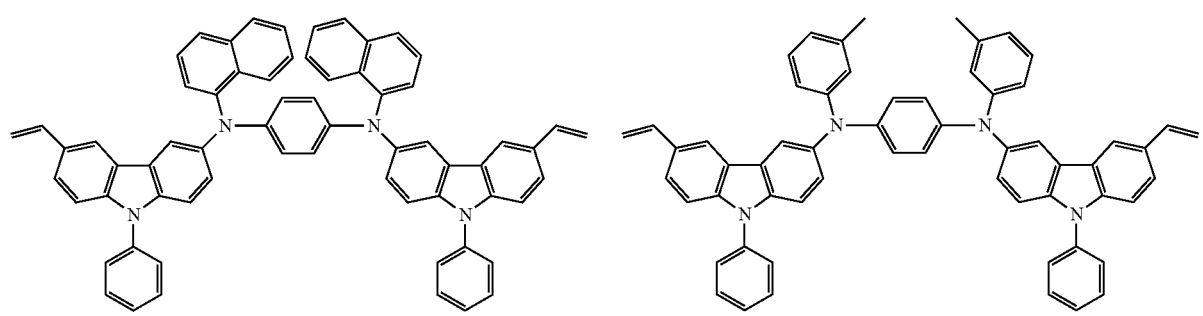

Chemical Formula 1-15
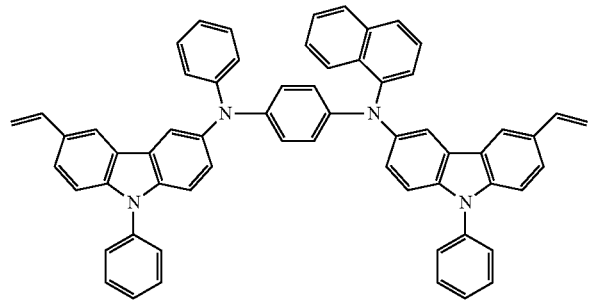
Chemical Formula 1-16
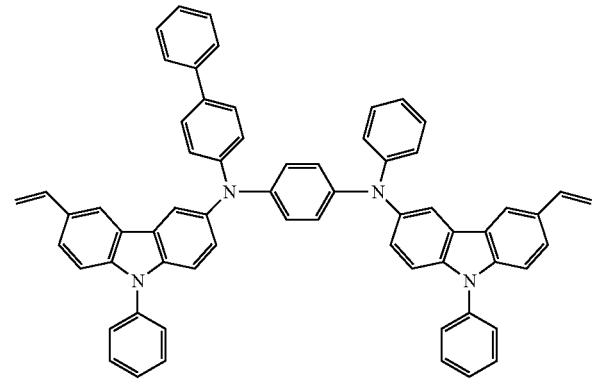
Chemical Formula 1-17
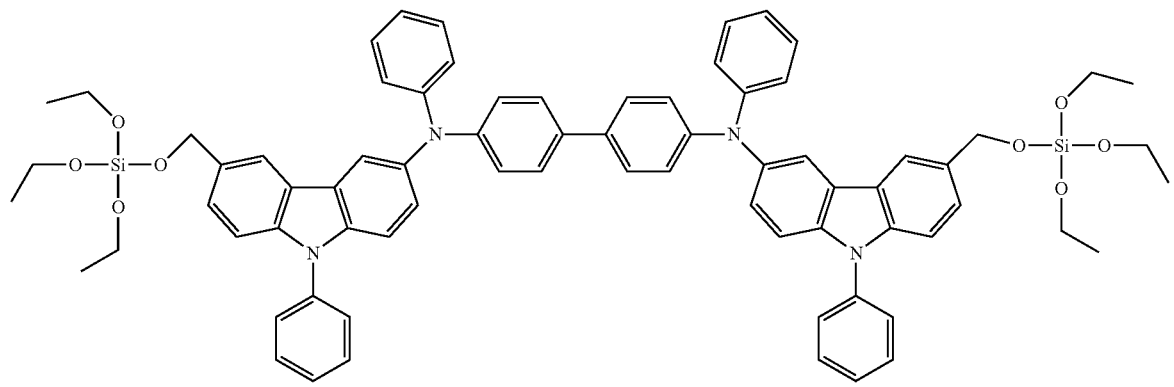
Chemical Formula 1-18
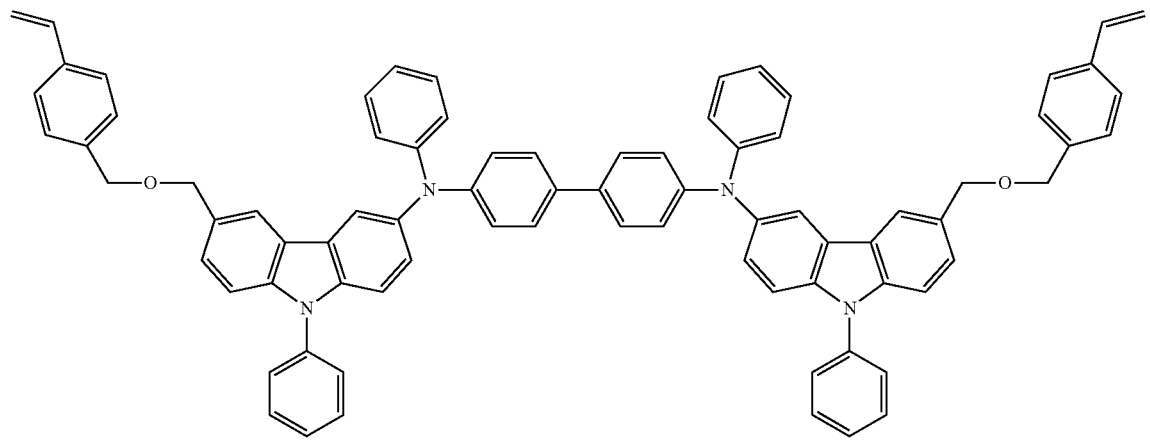

Chemical Formula 1-19
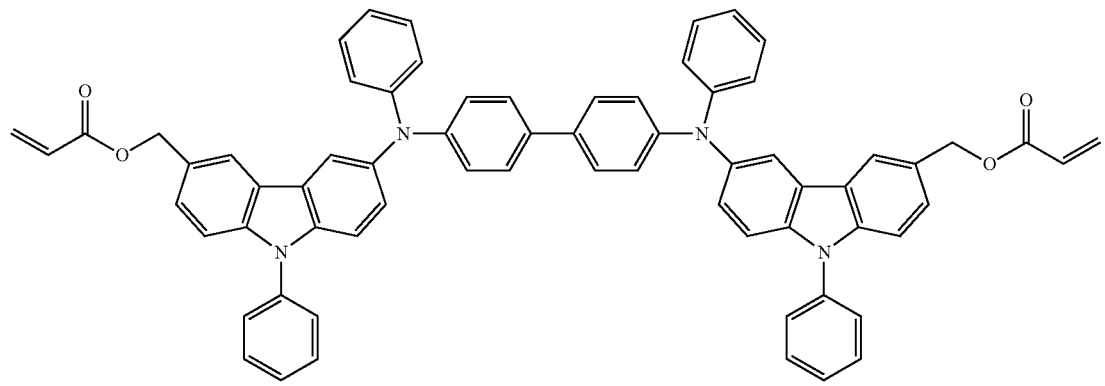
Chemical Formula 1-20
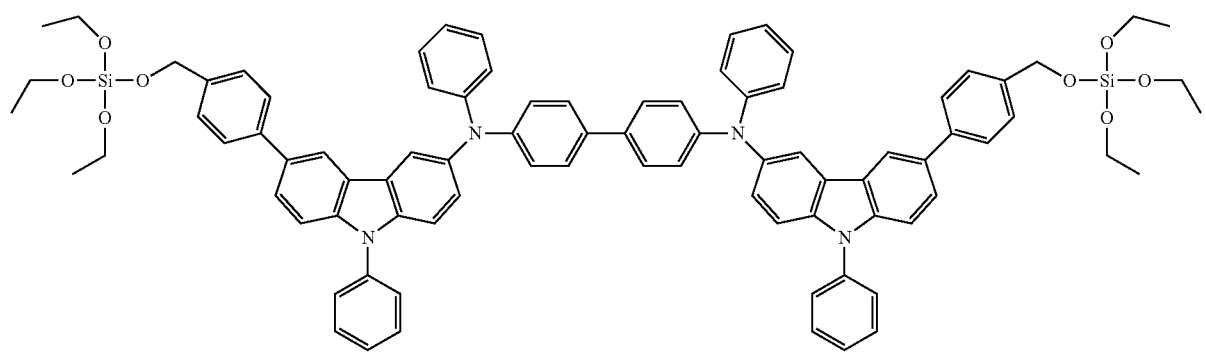
Chemical Formula 1-21
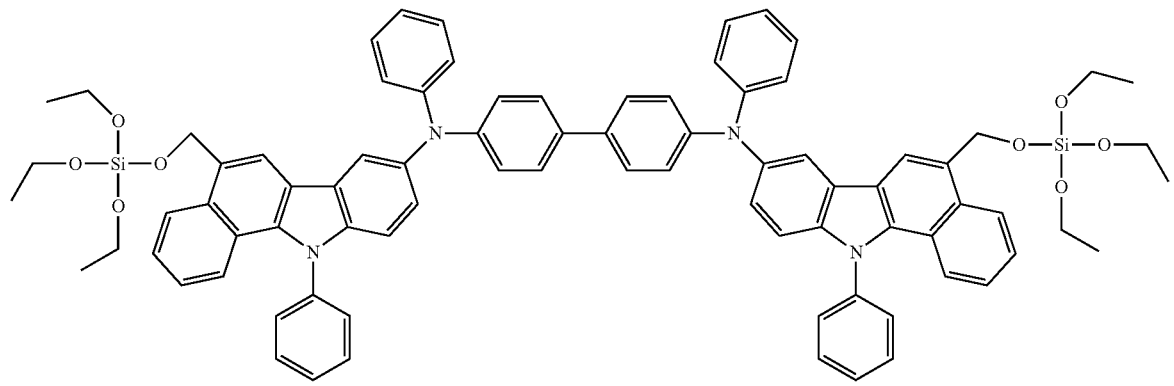
Chemical Formula 1-22
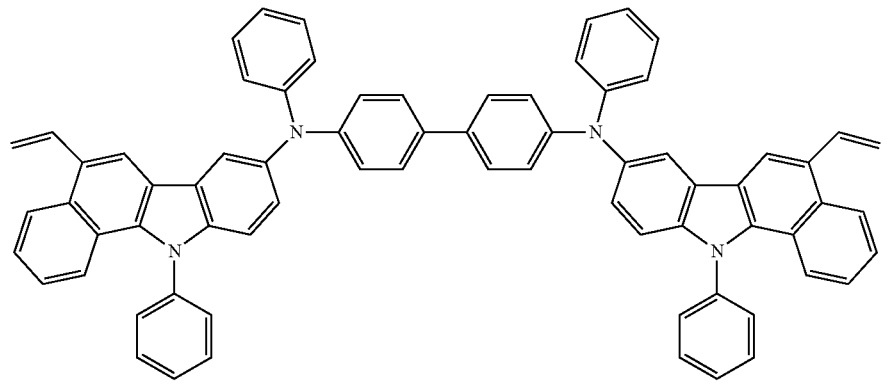

Chemical Formula 1-23
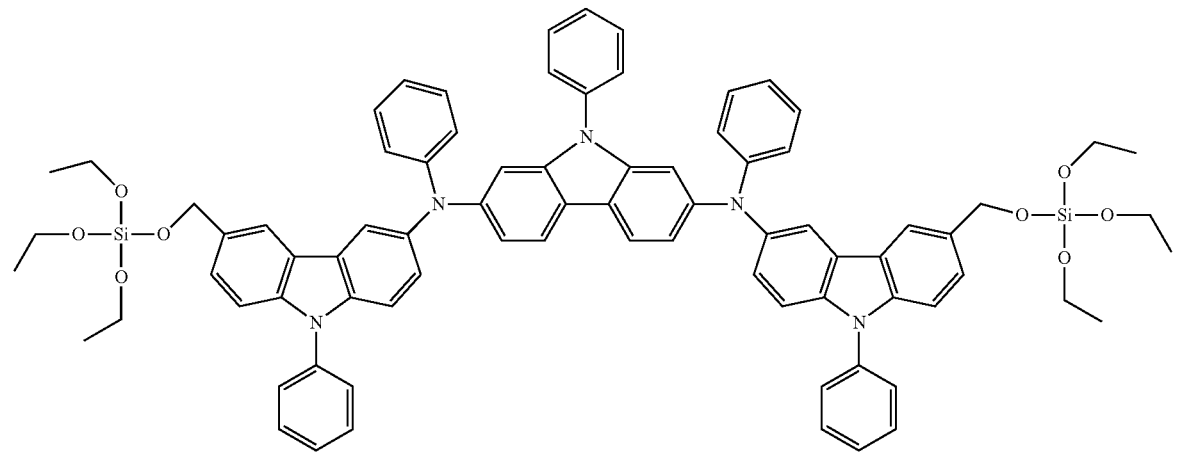
Chemical Formula 1-24
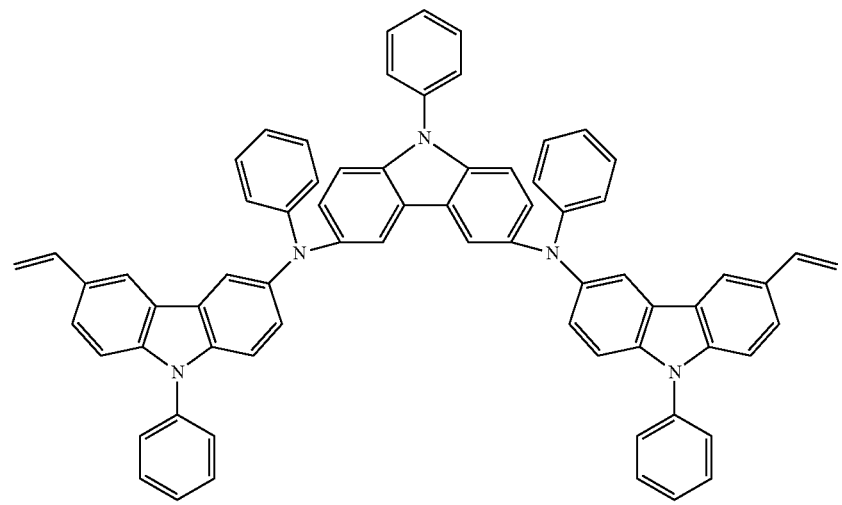
Chemical Formula 1-25
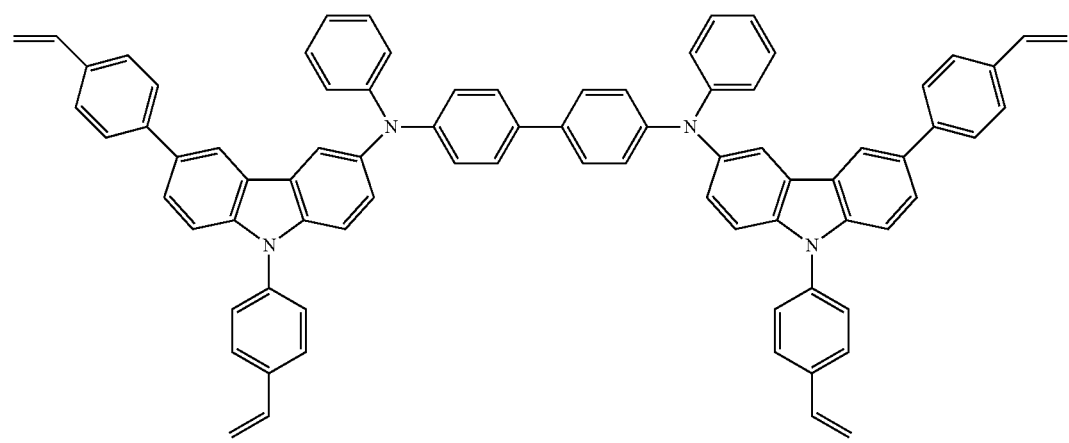

Chemical Formula 1-26
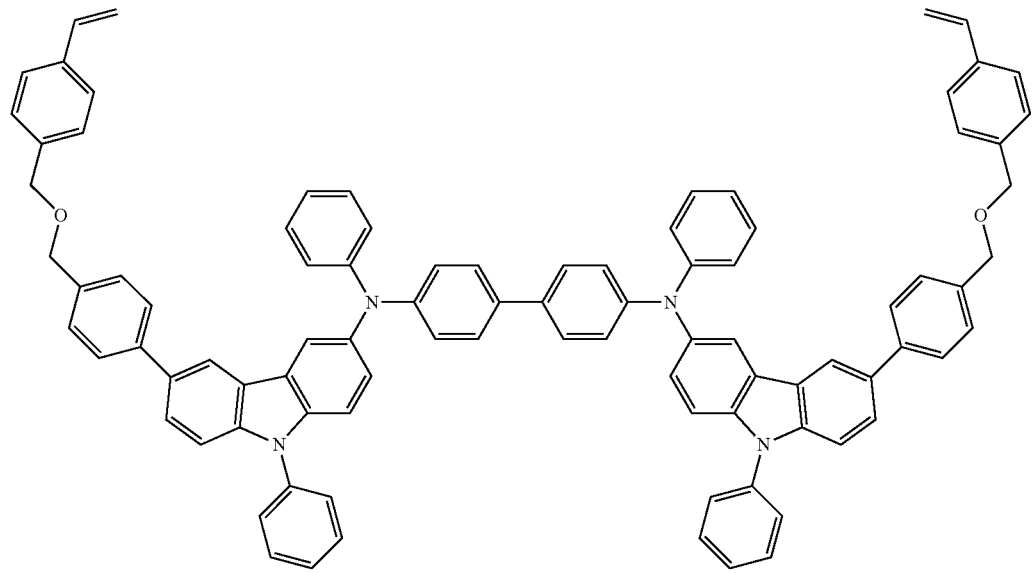
Chemical Formula 1-27
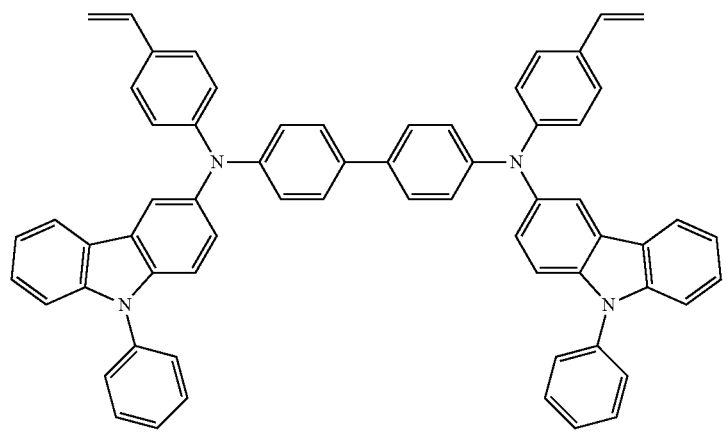
Chemical Formula 1-28
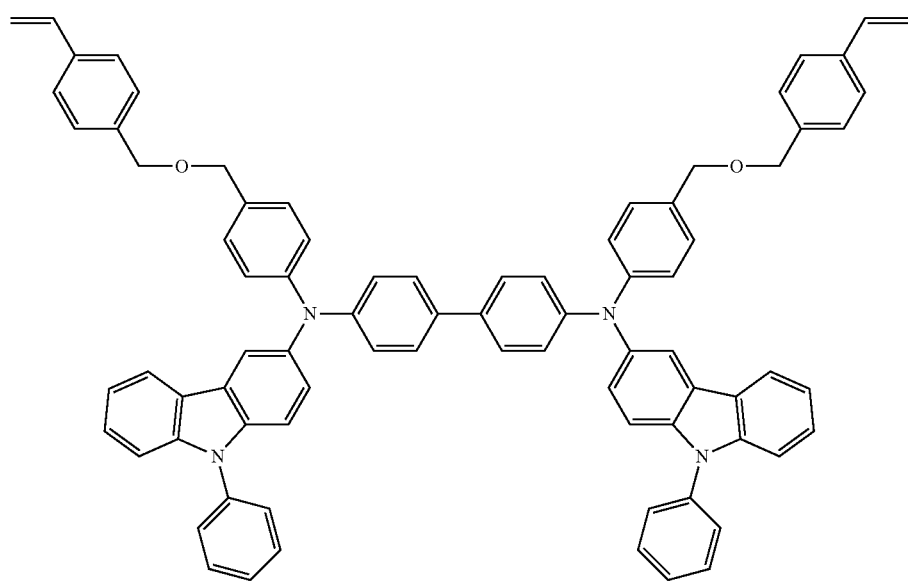

Chemical Formula 1-29
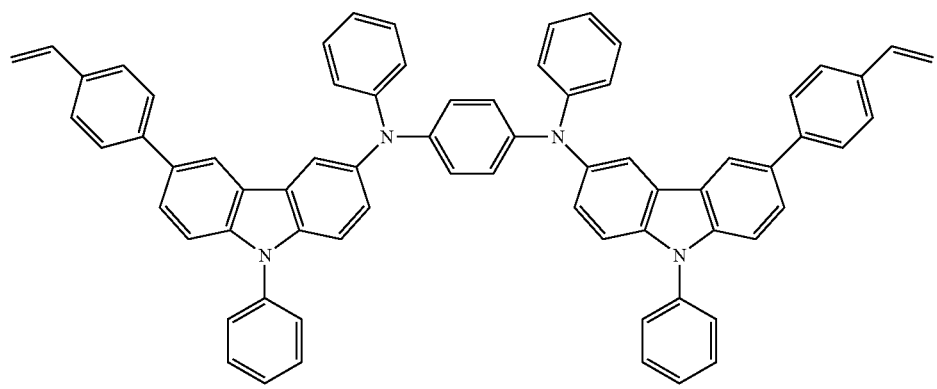
Chemical Formula 1-30
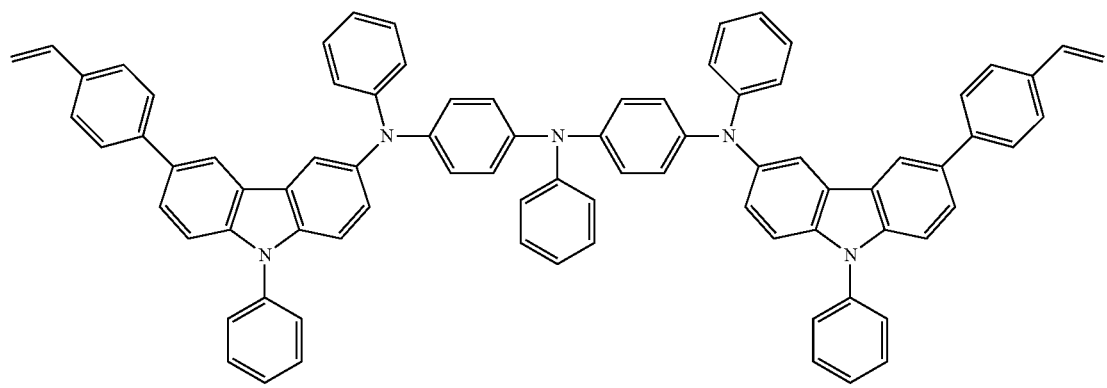
Chemical Formula 1-31
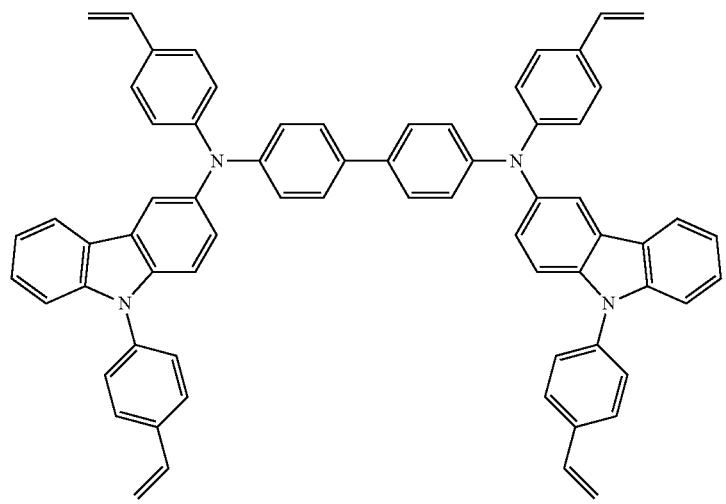

Chemical Formula 1-32

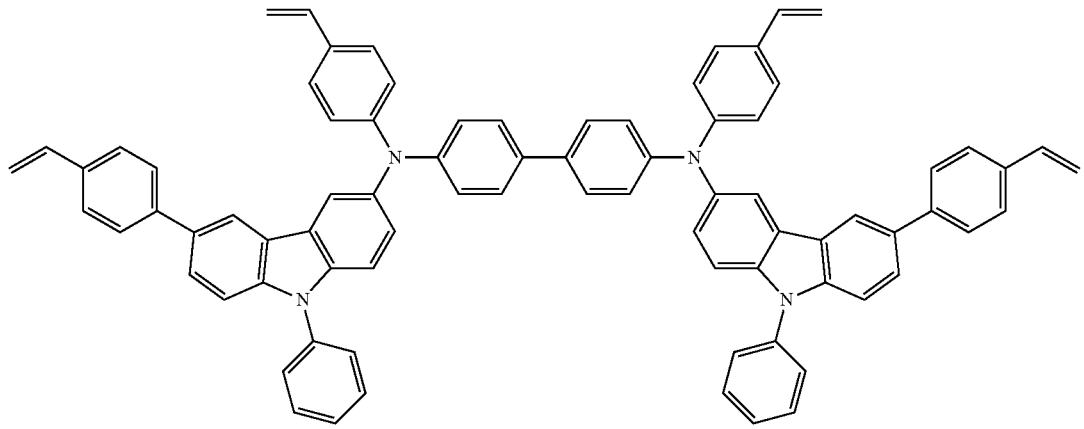

In one embodiment of the present specification, the charge transferring material or the light emitting material of the ink composition is included in 1 parts by weight to 10 parts by weight with respect to 100 parts by weight of the solvent. Being included in the above-mentioned content range is advantageous in obtaining a film having a target thickness by controlling the number of drops. Particularly, a film having a large thickness may be obtained, and an advantage of forming a flat film after drying is obtained.

In one embodiment of the present specification, the solvent comprising one or more types of Chemical Formulae 1 to 4 included in the ink composition has polarity, and thereby has excellent solubility for a functional material compared to solvents having non-polarity, and when forming a film using the ink composition comprising the charge transferring material or the light emitting material having the structure of Chemical Formula 5 in the solvent comprising one or more types of Chemical Formulae 1 to 4, a drying process time may be shortened, and a uniform film may be formed without phase separation.

In one embodiment of the present specification, the ink composition may further comprise one or two types of compounds selected from the group consisting of a compound introducing a crosslinkable functional group into the molecule, and a polymer compound.

In one embodiment of the present specification, the ink composition may further comprise a compound introducing a crosslinkable functional group into the molecule. When the coating composition further comprises a compound introducing a crosslinkable functional group into the molecule, the coating composition may have increased hardness.

According to one embodiment of the present specification, the compound introducing a crosslinkable functional group into the molecule has a molecular weight of 100 g/mol to 3,000 g/mol. In another embodiment of the present specification, the compound introducing a crosslinkable functional group into the molecule more preferably has a molecular weight of 500 g/mol to 2,000 g/mol.

In one embodiment of the present specification, the ink composition may further comprise a polymer compound. When the ink composition further comprises a polymer compound, the ink composition may have increased ink properties. In other words, the ink composition further comprising the polymer compound may provide proper viscosity for coating or inkjet, and may form a flat film.

In one embodiment of the present specification, solubility of the charge transferring material or the light emitting material for the solvent comprising one or more types of Chemical Formulae 1 to 4 is greater than or equal to 0.5 wt % and less than or equal to 15 wt %.

According to one embodiment of the present specification, the solvent comprising one or more types of Chemical Formulae 1 to 4 may have a boiling point of 170° C. or higher, and preferably higher than or equal to 180° C. and lower than or equal to 300° C. The boiling point of the solvent satisfying the above-mentioned range may prevent the ink from drying in an inkjet nozzle unit, and may secure discharge stability. In addition, it is also advantageous in forming a flat film.

In one embodiment of the present specification, the ink composition has viscosity of greater than or equal to 2 cP and less than or equal to 20 cP. More preferably, the viscosity is greater than or equal to 3 cP and less than or equal to 15 cP. Having the viscosity as in the above-mentioned range may have discharge stability, which is advantageous in manufacturing a device.

In one embodiment of the present specification, the polymer compound has a molecular weight of 10,000 g/mol to 200,000 g/mol.

In one embodiment of the present specification, the polymer compound may further comprise a crosslinkable functional group.

In one embodiment of the present specification, the ink composition may be a liquid phase. The "liquid phase" means in a liquid state at room temperature and atmospheric pressure.

According to one embodiment of the present specification, solvents other than the solvent comprising one or more types of Chemical Formulae 1 to 4 may be further included as a minor solvent when preparing the ink composition. Examples thereof may comprise solvents such as ether-based solvents such as phenoxytoluene or 3,4-dimethylanisole; ester-based solvents such as methyl benzoate or dimethyl phthalate; aromatic hydrocarbon-based solvents such as cyclohexylbenzene, methylnaphthalene, ethylnaphthalene, trimethylbenzene or mesitylene; aliphatic hydrocarbon-based solvents such as cyclohexane, methylcyclohexane, n-pentane, n-hexane, n-heptane, n-octane, n-nonane or n-decane; glycol ether-based solvents such as diethylene glycol butylmethyl ether or triethylene glycol monobenzyl ether; and fluorine-based solvents, however, the minor solvent is not limited thereto.

The minor solvent may be included in 0.1 wt % to 40 wt % and preferably in 1 wt % to 30 wt % with respect to the whole solvent.

In one embodiment of the present specification, the ink composition may further comprise one, two or more types of additives selected from the group consisting of thermal polymerization initiators and photopolymerization initiators.

Examples of the thermal polymerization initiator may comprise peroxides such as methyl ethyl ketone peroxide, methyl isobutyl ketone peroxide, acetylacetone peroxide, methylcyclohexanone peroxide, cyclohexanone peroxide, isobutyryl peroxide, 2,4-dichlorobenzoyl peroxide, bis-3,5,5-trimethyl hexanoyl peroxide, lauryl peroxide, benzoyl peroxide, p-chlorobenzoyl peroxide, dicumyl peroxide, 2,5-dimethyl-2,5-(t-butyloxy)-hexane, 1,3-bis(t-butylperoxyisopropyl)benzene, t-butyl cumyl peroxide, di-t-butyl peroxide, 2,5-dimethyl-2,5-(di-t-butylperoxy)hexane-3, tris-(t-butylperoxy)triazine, 1,1-di-t-butylperoxy-3,3,5-trimethylcyclohexane, 1,1-di-t-butylperoxycyclohexane, 2,2-di(t-butylperoxy)butane, 4,4-di-t-butylperoxy valeric acid n-butyl ester, 2,2-bis(4,4-t-butylperoxycyclohexyl)propane, t-butyl peroxyisobutyrate, di-t-butyl peroxyhexahydroterephthalate, t-butylperoxy-3,5,5-trimethylhexate, t-butyl peroxybenzoate or di-t-butyl peroxytrimethyl adipate; or azo-based such as azobis isobutylnitrile, azobis dimethylvaleronitrile or azobis cyclohexyl nitrile, but are not limited thereto.

Examples of the photopolymerization initiator may comprise acetophenone-based or ketal-based photopolymerization initiators such as diethoxyacetophenone, 2,2-dimethoxy-1,2-diphenyl ethan-1-one, 1-hydroxy-cyclohexyl-phenyl-ketone, 4-(2-hydroxyethoxy)phenyl-(2-hydroxy-2-propyl)ketone, 2-benzyl-2-dimethylamino-1-(4-morpholinophenyl)butanone-1,2-hydroxy-2-methyl-1-phenylpropan-1-one, 2-methyl-2-morpholino(4-methylthiophenyl)propan-1-one or 1-phenyl-1,2-propanedion-2-(o-ethoxycarbonyl)oxime; benzoin ether-based photopolymerization initiators such as benzoin, benzoin methyl ether, benzoin ethyl ether, benzoin isobutyl ether or benzoin isopropyl ether; benzophenone-based photopolymerization initiators such as benzophenone, 4-hydroxybenzophenone, 2-benzoylnaphthalene, 4-benzoylbiphenyl, 4-benzoyl phenyl ether, acrylated benzophenone or 1,4-benzoylbenzene; thioxanthone-based photopolymerization initiators such as 2-isopropylthioxanthone, 2-chlorothioxanthone, 2,4-dimethylthioxanthone, 2,4-diethylthioxanthone or 2,4-dichlorothioxanthone; and, as other photopolymerization initiators, ethyl anthraquinone, 2,4,6-trimethylbenzoyldiphenylphosphine oxide, 2,4,6-trimethylbenzoylphenylethoxyphosphine oxide, bis(2,4,6-trimethylbenzoyl)phenylphosphine oxide, bis(2,4-dimethoxybenzoyl)-2,4,4-trimethylpentylphosphine oxide, methylphenylglyoxyester, 9,10-phenanthrene, acridine-based compounds, triazine-based compounds, imidazole-based compounds, and the like. In addition, those having a photopolymerization facilitating effect may be used either alone or together with the photopolymerization initiator. Examples thereof may comprise triethanolamine, methyldiethanolamine, ethyl 4-dimethylaminobenzoate, isoamyl 4-dimethylaminobenzoate, (2-dimethylamino)ethyl benzoate, 4,4'-dimethylaminobenzophenone and the like, but are not limited thereto.

In one embodiment of the present specification, the ink composition may further comprise other additives such as a surfactant. The surfactant is preferably a nonionic surfactant, and may be a silicone-based or fluorine-based surfactant, but is not limited thereto.

In one embodiment of the present specification, the ink composition does not further comprise a p-doping material.

In another embodiment, the ink composition further comprises a p-doping material.

In the present specification, the p-doping material may also facilitate thermal curing or photocuring.

In the present specification, the p-doping material means a material enabling a host material to have a p semiconductor property. The p semiconductor property means a property receiving or transferring holes to a highest occupied molecular orbital (HOMO) energy level, that is, a property of a material having high hole conductivity.

The present specification also provides an organic light emitting device formed using the ink composition.

In one embodiment of the present specification, the organic light emitting device comprises a cathode; an anode provided opposite to the cathode; and one or more organic material layers provided between the cathode and the anode, wherein one or more layers of the organic material layers are formed using the ink composition.

In one embodiment of the present specification, the organic material layer formed using the ink composition is a hole transfer layer, a hole injection layer, or a layer carrying out hole transfer and hole injection at the same time.

In another embodiment, the organic material layer formed using the ink composition is a light emitting layer.

In one embodiment of the present specification, the organic light emitting device further comprises one, two or more layers selected from the group consisting of a hole injection layer, a hole transfer layer, an electron transfer layer, an electron injection layer, an electron blocking layer and a hole blocking layer.

In another embodiment, the organic light emitting device may be an organic light emitting device having a structure in which an anode, one or more organic material layers and a cathode are consecutively laminated on a substrate (normal type).

In another embodiment, the organic light emitting device may be an organic light emitting device having a structure in a reverse direction in which a cathode, one or more organic material layers and an anode are consecutively laminated on a substrate (inverted type).

The organic material layer of the organic light emitting device of the present specification may be formed in a single layer structure, but may also be formed in a multilayer structure in which two or more organic material layers are laminated. For example, the organic light emitting device of the present disclosure may have a structure comprising a hole injection layer, a hole transfer layer, a light emitting layer, an electron transfer layer, an electron injection layer and the like as the organic material layer. However, the structure of the organic light emitting device is not limited thereto, and may comprise less numbers of organic material layers.

For example, a structure of the organic light emitting device according to one embodiment of the present specification is illustrated in the Figure.

The Figure illustrates a structure of the organic light emitting device in which an anode (201), a hole injection layer (301), a hole transfer layer (401), a light emitting layer (501), an electron transfer layer (601) and a cathode (701) are consecutively laminated on a substrate (101).

In the Figure, the hole injection layer (301), the hole transfer layer (401) or the light emitting layer (501) is formed using the ink composition.

The Figure illustrates the organic light emitting device, however, the organic light emitting device is not limited thereto.

When the organic light emitting device comprises a plurality of organic material layers, the organic material layers may be formed with materials that are the same as or different from each other.

The organic light emitting device of the present specification may be manufactured using materials and methods known in the art, except that one or more layers of the organic material layers are formed using the ink composition.

For example, the organic light emitting device of the present specification may be manufactured by consecutively laminating an anode, an organic material layer and a cathode on a substrate. Herein, the organic light emitting device may be manufactured by forming an anode on a substrate by depositing a metal, a metal oxide having conductivity, or an alloy thereof using a physical vapor deposition (PVD) method such as sputtering or e-beam evaporation, and forming an organic material layer comprising a hole injection layer, a hole transfer layer, a light emitting layer and an electron transfer layer thereon, and then depositing a material capable of being used as a cathode thereon. In addition to such a method, the organic light emitting device may also be manufactured by consecutively depositing a cathode material, an organic material layer and an anode material on a substrate.

The present specification also provides a method for manufacturing an organic light emitting device formed using the ink composition.

Specifically, the method for manufacturing an organic light emitting device in one embodiment of the present specification comprises preparing a substrate; forming a cathode or an anode on the substrate; forming one or more organic material layers on the cathode or the anode; and forming an anode or a cathode on the organic material layers, wherein one or more layers of the organic material layers are formed using the ink composition.

In one embodiment of the present specification, the organic material layer formed using the ink composition is formed using an inkjet printing method.

In one embodiment of the present specification, the time of heat treating the organic material layer formed using the ink composition is preferably within 1 hour and more preferably within 30 minutes.

In one embodiment of the present specification, the atmosphere of heat treating the organic material layer formed using the ink composition is preferably inert gas such as argon or nitrogen.

When comprising the heat treating or light treating in forming the organic material layer formed using the ink composition, an organic material layer comprising a thin-filmed structure by a plurality of functional groups crosslinkable by heat or light included in the ink composition forming crosslinkage may be provided. In this case, being dissolved, morphologically affected or decomposed by the solvent deposited on the surface of the organic material layer formed using the ink composition may be prevented.

Accordingly, when the organic material layer formed using the ink composition is formed comprising the heat treating or light treating, resistance for the solvent increases, and a multilayer may be formed by repeatedly performing a solution depositing and crosslinking method, and device lifetime properties may be enhanced by increasing stability.

In one embodiment of the present specification, the ink composition may be dispersed by being mixed to a polymer binder.

In one embodiment of the present specification, as the polymer binder, those that do not extremely inhibit charge transfer and do not strongly absorb visible rays are preferably used. Examples of the polymer binder may comprise poly(N-vinylcarbazole), polyaniline and derivatives thereof, polythiophene and derivatives thereof, poly(p-phenylenevinylene) and derivatives thereof, poly(2,5-thienylenevinylene) and derivatives thereof, polycarbonate, polyacrylate, polymethyl acrylate, polymethyl methacrylate, polystyrene, polyvinyl chloride, polysiloxane and the like.

As the anode material, materials having large work function are normally preferred so that hole injection to an organic material layer is smooth. Specific examples of the anode material capable of being used in the present disclosure comprise metals such as vanadium, chromium, copper, zinc and gold, or alloys thereof; metal oxides such as zinc oxide, indium oxide, indium tin oxide (ITO) and indium zinc oxide (IZO); combinations of metals and oxides such as $ZnO:Al$ or $SnO_2:Sb$; conductive polymers such as poly(3-methylthiophene), poly[3,4-(ethylene-1,2-dioxy)thiophene] (PEDOT), polypyrrole and polyaniline, and the like, but are not limited thereto.

As the cathode material, materials having small work function are normally preferred so that electron injection to an organic material layer is smooth. Specific examples of the cathode material comprise metals such as magnesium, calcium, sodium, potassium, titanium, indium, yttrium, lithium, gadolinium, aluminum, silver, tin and lead, or alloys thereof; multilayer structure materials such as $LiF/Al$ or $LiO_2/Al$, and the like, but are not limited thereto.

The hole injection layer is a layer that injects holes from an electrode, and the hole injection material is preferably a compound that has an ability to transfer holes, therefore, has a hole injection effect in an anode, has an excellent hole injection effect for a light emitting layer or a light emitting material, prevents excitons generated in the light emitting layer from moving to an electron injection layer or an electron injection material, and in addition thereto, has an excellent thin film forming ability. The highest occupied molecular orbital (HOMO) of the hole injection material is preferably in between the work function of an anode material and the HOMO of surrounding organic material layers. Specific examples of the hole injection material comprise metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer is a layer that receives holes from a hole injection layer and transfers the holes to a light emitting layer, and as the hole transfer material, materials capable of receiving holes from an anode or a hole injection layer, moving the holes to a light emitting layer, and having high mobility for the holes are suited. Specific examples thereof comprise arylamine-based organic materials, conductive polymers, block copolymers having conjugated parts and non-conjugated parts together, and the like, but are not limited thereto.

The light emitting material is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof comprise 8-hydroxyquinoline aluminum complexes (Alq$_3$); carbazole-based compounds; dimerized styryl compounds; BAlq; 10-hydroxybenzo quinoline-metal compounds; benzoxazole-, benzthiazole- and benzimidazole-based compounds; poly(p-phenylenevinylene) (PPV)-based polymers; spiro compounds; polyfluorene, rubrene, and the like, but are not limited thereto.

The light emitting layer may comprise a host material and a dopant material. The host material comprises fused aromatic ring derivatives, heteroring-containing compounds or the like. Specifically, the fused aromatic ring derivative comprises anthracene derivatives, pyrene derivatives, naphthalene derivatives, pentacene derivatives, phenanthrene compounds, fluoranthene compounds and the like, and the heteroring-containing compound comprises carbazole derivatives, dibenzofuran derivatives, ladder-type furan compounds, pyrimidine derivatives and the like, however, the material is not limited thereto.

The dopant material comprises aromatic amine derivatives, styrylamine compounds, boron complexes, fluoranthene compounds, metal complexes and the like. Specifically, the aromatic amine derivative is a fused aromatic ring derivative having a substituted or unsubstituted arylamino group and comprises arylamino group—comprising pyrene, anthracene, chrysene, periflanthene and the like, and the styrylamine compound is a compound in which substituted or unsubstituted arylamine is substituted with at least one arylvinyl group, and one, two or more substituents selected from the group consisting of an aryl group, a silyl group, an alkyl group, a cycloalkyl group and an arylamino group are substituted or unsubstituted. Specifically, styrylamine, styryldiamine, styryltriamine, styryltetramine or the like is included, however, the styrylamine compound is not limited thereto. In addition, the metal complex comprises iridium complexes, platinum complexes or the like, but is not limited thereto.

The electron transfer layer is a layer that receives electrons from an electron injection layer and transfers the electrons to a light emitting layer, and as the electron transfer material, materials capable of favorably receiving electrons from a cathode, moving the electrons to a light emitting layer, and having high mobility for the electrons are suited. Specific examples thereof comprise Al complexes of 8-hydroxyquinoline; complexes comprising Alq$_3$; organic radical compounds; hydroxyflavon-metal complexes, and the like, but are not limited thereto. The electron transfer layer may be used together with any desired cathode material as used in the art. Particularly, examples of the suitable cathode material include common materials that have small work function, and in which an aluminum layer or a silver layer follows. Specifically, the cathode material comprises cesium, barium, calcium, ytterbium and samarium, and in each case, an aluminum layer or a silver layer follows.

The electron injection layer is a layer that injects electrons from an electrode, and the electron injection material is preferably a compound that has an ability to transfer electrons, has an electron injection effect from a cathode, has an excellent electron injection effect for a light emitting layer or a light emitting material, prevents excitons generated in the light emitting layer from moving to a hole injection layer, and in addition thereto, has an excellent thin film forming ability. Specific examples thereof comprise fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited there.

The metal complex compound comprises 8-hydroxyquinolinato lithium, bis(8-hydroxyquinolinato)zinc, bis(8-bis(8-hydroxyquinolinato)manganese, tris(8-hydroxyquinolinato)aluminum, tris(2-methyl-8-hydroxyquinolinato) aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium and the like, but is not limited thereto.

The hole blocking layer is a layer blocking holes from reaching a cathode, and generally, may be formed under the same condition as the hole injection layer. Specifically, oxadiazole derivatives or triazole derivatives, phenanthroline derivatives, BCP, aluminum complexes and the like are included, however, the material is not limited thereto.

The organic light emitting device according to the present specification may be a top-emission type, a bottom-emission type or a dual-emission type depending on the materials used.

Hereinafter, the present specification will be described in detail with reference to examples in order to specifically describe the present specification. However, the examples according to the present specification may be modified to various different forms, and the scope of the present specification is not to be construed as being limited to the examples described below. Examples of the present specification are provided in order to more fully describe the present specification to those having average knowledge in the art.

EXAMPLE

Types of the solvent used in the examples are shown in the following Table 1, and types of the solvent used in the comparative examples are shown in the following Table 2.

TABLE 1

| Solvent | Boiling Point (° C.) | Abbreviation |
| --- | --- | --- |
| 2-(1-Cyclohexenyl)cyclohexanone | 281.9 | CHECHO |
| 2-Cyclohexylcyclohexanone | 264 | CHCHO |
| 4-Pentylcyclohexanone | 225.1 | PenCHO |
| 3,3,5-Trimethylcyclohexanone | 186 | TMCHO |
| Isophorone | 215.2 | ISP |
| 4-Tert-butylacetophenone | 285-286 | TBAP |
| ε-Caprolactone | 235-236 | CPL |
| δ-Decanolactone | 123 (3 mmHg) | DCL |

TABLE 2

| Solvent | Boiling Point (° C.) | Abbreviation |
| --- | --- | --- |
| 3-Phenoxytoluene | 271-273 | PT |
| Cyclohexylbenzene | 240 | CHB |
| Tetralin | 206-208 | TTN |
| Dibenzyl ether | 295-298 | DBE |
| Decahydronaphthalene | 190 | DCHNT |

Example 1

An ink composition was prepared by dissolving Chemical Formula 1-1 in 2 parts by weight with respect to 100 parts by weight of a solvent CHECHO.

Examples 2 to 56 and Comparative Examples 1 to 35

Ink compositions of Examples 2 to 56 and Comparative Examples 1 to 35 were prepared in the same manner as in Example 1 except that materials and solvents described in the following Tables 3 to 9 were used.

Solubility, discharge stability and uniformity of the formed film of the ink compositions prepared in Examples 1 to 56 and Comparative Examples 1 to 35 were measured and described in the following Tables 3 to 9, and when discharge stability and film uniformity were not able to be evaluated due to unfavorable solubility, it was marked as "–".

1) Evaluation of Solubility: less than 0.5 wt %: Poor greater than or equal to 0.5 wt % and less than 1.0 wt %: Fine greater than or equal to 1.0 wt % and less than 5.0 wt %: Good greater than or equal to 5.0 wt %: Very Good 2) Evaluation of discharge stability: measured using Fujifilm, Dimatix DMP-2800 equipment, 10 pl cartridge (DMC-11610), and the following criteria was used in the evaluation.

stably discharged without liquid droplet wavering: O.K liquid droplet wavered or not discharged: N.G 3) Evaluation of film uniformity: After jetting the ink on the ITO substrate, the result was dried and how well the film was formed was observed, and the following criteria was used in the evaluation.

film was favorably formed without phase separation: O.K phase was separated, or film was not formed well: N.G

TABLE 3

| Material | | Solvent | Solubility[1] | Discharge Stability[2] | Film Formation[3] |
|---|---|---|---|---|---|
| Chemical Formula 1-1 | Example 1 | CHECHO | Very Good | O.K | O.K |
| | Example 2 | CHCHO | Very Good | O.K | O.K |
| | Example 3 | PenCHO | Good | O.K | O.K |
| | Example 4 | TMCHO | Good | O.K | O.K |
| | Example 5 | ISP | Very Good | O.K | O.K |
| | Example 6 | TBAP | Good | O.K | O.K |
| | Example 7 | CPL | Good | O.K | O.K |
| | Example 8 | DCL | Good | O.K | O.K |
| | Comparative Example 1 | PT | Poor | — | — |
| | Comparative Example 2 | CHB | Poor | — | — |
| | Comparative Example 3 | TTN | Poor | — | — |
| | Comparative Example 4 | DBE | Poor | — | — |
| | Comparative Example 5 | DCHNT | Poor | — | — |

TABLE 4

| Material | | Solvent | Solubility[1] | Discharge Stability[2] | Film Formation[3] |
|---|---|---|---|---|---|
| Chemical Formula 1-2 | Example 9 | CHECHO | Very Good | O.K | O.K |
| | Example 10 | CHCHO | Very Good | O.K | O.K |
| | Example 11 | PenCHO | Good | O.K | O.K |
| | Example 12 | TMCHO | Good | O.K | O.K |
| | Example 13 | ISP | Very Good | O.K | O.K |
| | Example 14 | TBAP | Good | O.K | O.K |
| | Example 15 | CPL | Good | O.K | O.K |
| | Example 16 | DCL | Good | O.K | O.K |
| | Comparative Example 6 | PT | Fine | O.K | N.G |
| | Comparative Example 7 | CHB | Poor | — | — |
| | Comparative Example 8 | TTN | Fine | O.K | N.G |
| | Comparative Example 9 | DBE | Poor | — | — |
| | Comparative Example 10 | DCHNT | Poor | — | — |

TABLE 5

| Material | | Solvent | Solubility[1] | Discharge Stability[2] | Film Formation[3] |
|---|---|---|---|---|---|
| Chemical Formula 1-5 | Example 17 | CHECHO | Very Good | O.K | O.K |
| | Example 18 | CHCHO | Very Good | O.K | O.K |
| | Example 19 | PenCHO | Good | O.K | O.K |
| | Example 20 | TMCHO | Good | O.K | O.K |
| | Example 21 | ISP | Good | O.K | O.K |
| | Example 22 | TBAP | Good | O.K | O.K |
| | Example 23 | CPL | Good | O.K | O.K |
| | Example 24 | DCL | Good | O.K | O.K |
| | Comparative Example 11 | PT | Poor | — | — |
| | Comparative Example 12 | CHB | Poor | — | — |
| | Comparative Example 13 | TTN | Poor | — | — |
| | Comparative Example 14 | DBE | Poor | — | — |
| | Comparative Example 15 | DCHNT | Poor | — | — |

TABLE 6

| Material | | Solvent | Solubility[1] | Discharge Stability[2] | Film Formation[3] |
|---|---|---|---|---|---|
| Chemical Formula 1-14 | Example 25 | CHECHO | Very Good | O.K | O.K |
| | Example 26 | CHCHO | Very Good | O.K | O.K |
| | Example 27 | PenCHO | Good | O.K | O.K |
| | Example 28 | TMCHO | Good | O.K | O.K |
| | Example 29 | ISP | Very Good | O.K | O.K |
| | Example 30 | TBAP | Good | O.K | O.K |
| | Example 31 | CPL | Very Good | O.K | O.K |
| | Example 32 | DCL | Good | O.K | O.K |
| | Comparative Example 16 | PT | Poor | — | — |
| | Comparative Example 17 | CHB | Poor | — | — |
| | Comparative Example 18 | TTN | Fine | O.K | N.G |
| | Comparative Example 19 | DBE | Poor | — | — |
| | Comparative Example 20 | DCHNT | Poor | — | — |

TABLE 7

| Material | Solvent | | Solubility[1] | Discharge Stability[2] | Film Formation[3] |
|---|---|---|---|---|---|
| Chemical Formula 1-18 | Example 33 | CHECHO | Very Good | O.K | O.K |
| | Example 34 | CHCHO | Very Good | O.K | O.K |
| | Example 35 | PenCHO | Very Good | O.K | O.K |
| | Example 36 | TMCHO | Very Good | O.K | O.K |
| | Example 37 | ISP | Very Good | O.K | O.K |
| | Example 38 | TBAP | Good | O.K | O.K |
| | Example 39 | CPL | Very Good | O.K | O.K |
| | Example 40 | DCL | Good | O.K | O.K |
| | Comparative Example 21 | PT | Poor | — | — |
| | Comparative Example 22 | CHB | Poor | — | — |
| | Comparative Example 23 | TTN | Fine | O.K | N.G |
| | Comparative Example 24 | DBE | Poor | — | — |
| | Comparative Example 25 | DCHNT | Poor | — | — |

TABLE 8

| Material | Solvent | | Solubility[1] | Discharge Stability[2] | Film Formation[3] |
|---|---|---|---|---|---|
| Chemical Formula 1-19 | Example 41 | CHECHO | Good | O.K | O.K |
| | Example 42 | CHCHO | Good | O.K | O.K |
| | Example 43 | PenCHO | Good | O.K | O.K |
| | Example 44 | TMCHO | Good | O.K | O.K |
| | Example 45 | ISP | Very Good | O.K | O.K |
| | Example 46 | TBAP | Good | O.K | O.K |
| | Example 47 | CPL | Good | O.K | O.K |
| | Example 48 | DCL | Good | O.K | O.K |
| | Comparative Example 26 | PT | Poor | — | — |
| | Comparative Example 27 | CHB | Poor | — | — |
| | Comparative Example 28 | TTN | Poor | — | — |
| | Comparative Example 29 | DBE | Poor | — | — |
| | Comparative Example 30 | DCHNT | Poor | — | — |

TABLE 9

| Material | Solvent | | Solubility[1] | Discharge Stability[2] | Film Formation[3] |
|---|---|---|---|---|---|
| Chemical Formula 1-27 | Example 49 | CHECHO | Good | O.K | O.K |
| | Example 50 | CHCHO | Good | O.K | O.K |
| | Example 51 | PenCHO | Good | O.K | O.K |
| | Example 52 | TMCHO | Good | O.K | O.K |
| | Example 53 | ISP | Very Good | O.K | O.K |
| | Example 54 | TBAP | Good | O.K | O.K |
| | Example 55 | CPL | Good | O.K | O.K |
| | Example 56 | DCL | Good | O.K | O.K |
| | Comparative Example 31 | PT | Poor | — | — |
| | Comparative Example 32 | CHB | Poor | — | — |
| | Comparative Example 33 | TTN | Poor | — | — |
| | Comparative Example 34 | DBE | Poor | — | — |
| | Comparative Example 35 | DCHNT | Poor | — | — |

From Tables 3 to 9, it was identified that the ink compositions prepared in Examples 1 to 56 had very superior solubility, discharge stability and film uniformity compared to the ink compositions prepared in Comparative Examples 1 to 35.

The invention claimed is:

1. An ink composition comprising:
a charge transferring material or a light emitting material; and
a solvent represented by Chemical Formula 1:

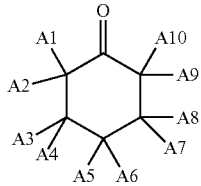

[Chemical Formula 1]

wherein A1 to A10 are the same as or different from each other, and each independently hydrogen; deuterium; a hydroxyl group; a carbonyl group; an ester group; a substituted or unsubstituted alkyl group; a substituted or unsubstituted cycloalkyl group; a substituted or unsubstituted cycloalkenyl group; a substituted or unsubstituted alkoxy group; a substituted or unsubstituted aryl group; or a substituted or unsubstituted amine group, and at least one of A1 to A10 is a substituted or unsubstituted cycloalkyl group, or a substituted or unsubstituted cycloalkenyl group.

2. The ink composition of claim 1, wherein solubility of the charge transferring material or the light emitting material for the solvent is from 0.5 wt % to 15 wt %.

3. The ink composition of claim 1, wherein the solvent has a boiling point of 170° C. or higher.

4. The ink composition of claim 1, comprising the charge transferring material or the light emitting material in 0.5 parts by weight to 15 parts by weight with respect to 100 parts by weight of the solvent.

5. The ink composition of claim 1, wherein the ink composition has a viscosity of greater than or equal to 2 cP and less than or equal to 20 cP.

6. The ink composition of claim 1, wherein the charge transferring material or the light emitting material is represented by the following Chemical Formula 5:

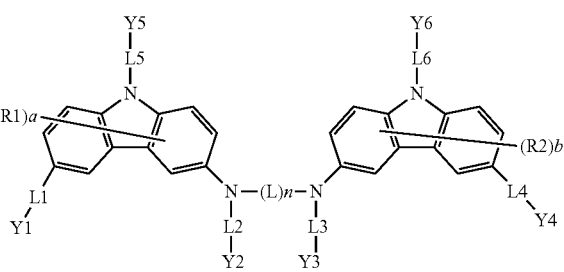

[Chemical Formula 5]

in Chemical Formula 5,
L is a substituted or unsubstituted arylene group; a substituted or unsubstituted divalent heterocyclic group; or -L7—NR'-L8-, L7 and L8 are the same as or different from each other, and each independently a substituted or unsubstituted arylene group, and R' is a substituted or unsubstituted aryl group; or a substituted or unsubstituted heterocyclic group;

L1 and L4 are the same as or different from each other, and each independently a direct bond; a substituted or unsubstituted arylene group; or a substituted or unsubstituted divalent heterocyclic group;

L2 and L3 are the same as or different from each other, and each independently a direct bond; a substituted or unsubstituted alkylene group having 1 to 30 carbon atoms; a substituted or unsubstituted alkenylene group having 2 to 30 carbon atoms; a substituted or unsubstituted arylene group having 6 to 30 carbon atoms; or a substituted or unsubstituted divalent heterocyclic group having 2 to 30 carbon atoms;

L5 and L6 are the same as or different from each other, and each independently a substituted or unsubstituted alkylene group having 1 to 30 carbon atoms; a substituted or unsubstituted alkenylene group having 2 to 30 carbon atoms; a substituted or unsubstituted arylene group having 6 to 30 carbon atoms; or a substituted or unsubstituted divalent heterocyclic group having 2 to 30 carbon atoms;

a and b are each an integer of 1 to 6;

when a and b are each 2 or greater, R1 s and R2 s are the same as or different from each other;

R1 and R2 are the same as or different from each other, and each independently hydrogen; deuterium; a substituted or unsubstituted alkyl group having 1 to 30 carbon atoms; a substituted or unsubstituted alkoxy group having 1 to 30 carbon atoms; a substituted or unsubstituted aryl group having 6 to 30 carbon atoms; a substituted or unsubstituted arylamine group; or a substituted or unsubstituted heterocyclic group having 2 to 30 carbon atoms, or adjacent substituents bond to each other to form a substituted or unsubstituted hydrocarbon ring; or a substituted or unsubstituted heterocyclic group;

n is an integer of 1 to 4;

when n is an integer of 2 or greater, two or more Ls are the same as or different from each other; and Y1 to Y6 are the same as or different from each other, and each independently hydrogen; or a functional group crosslinkable by heat or light, and at least one of Y1 to Y4 is a functional group crosslinkable by heat or light.

7. The ink composition of claim 6, wherein Y1 to Y6 are the same as or different from each other, and each independently hydrogen; or any one of the following structures:

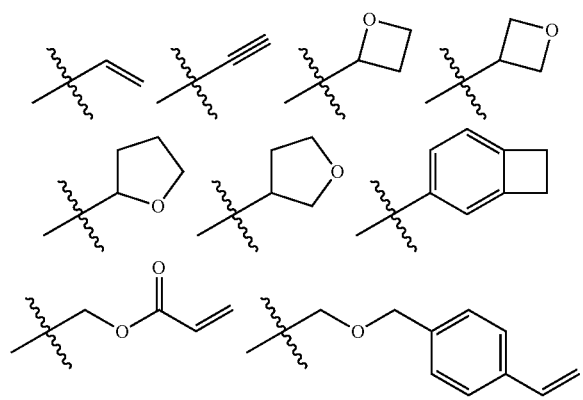

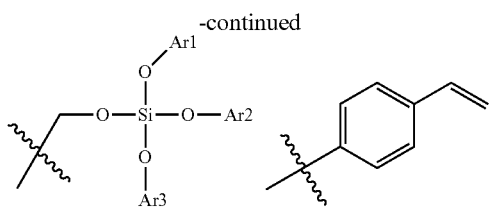

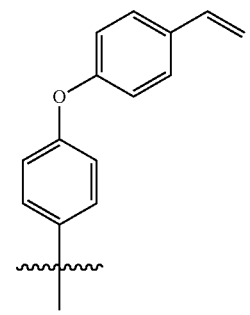

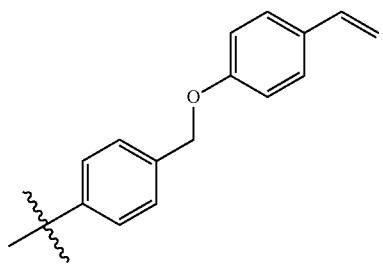

in the structures,

Ar1 to Ar3 are the same as or different from each other, and each independently a substituted or unsubstituted alkyl group having 1 to 6 carbon atoms.

8. A method for manufacturing an organic light emitting device comprising:

preparing a substrate;

forming a cathode or an anode on the substrate;

forming an organic material layer on the cathode or the anode; and forming an anode or a cathode on the organic material layer, wherein the forming of the organic material layers comprises forming one or more layers using the ink composition of claim 1.

9. The method for manufacturing an organic light emitting device of claim 8, wherein the organic material layer formed using the ink composition is formed using an inkjet printing method.

10. The ink composition of claim 1, wherein A1 to A10 are the same as or different from each other, and each independently hydrogen; deuterium; a substituted or unsubstituted alkyl group having 1 to 20 carbon atoms; a substituted or unsubstituted cycloalkyl group having 3 to 40 carbon atoms; a substituted or unsubstituted cycloalkenyl group having 3 to 40 carbon atoms; or a substituted or unsubstituted aryl group having 6 to 40 carbon atoms, and at least one of A1 to A10 is a substituted or unsubstituted cycloalkyl group, or a substituted or unsubstituted cycloalkenyl group.

11. The ink composition of claim 1, wherein Chemical Formula 1 is any one of the following structures:
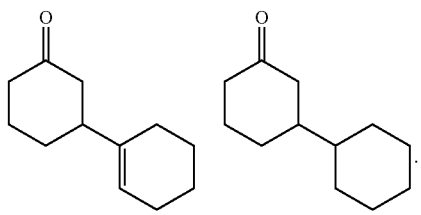
12. The ink composition of claim 6, wherein Chemical Formula 5 is represented by any one of the following Chemical Formulae 1-1 to 1-32:
Chemical Formula 1-1
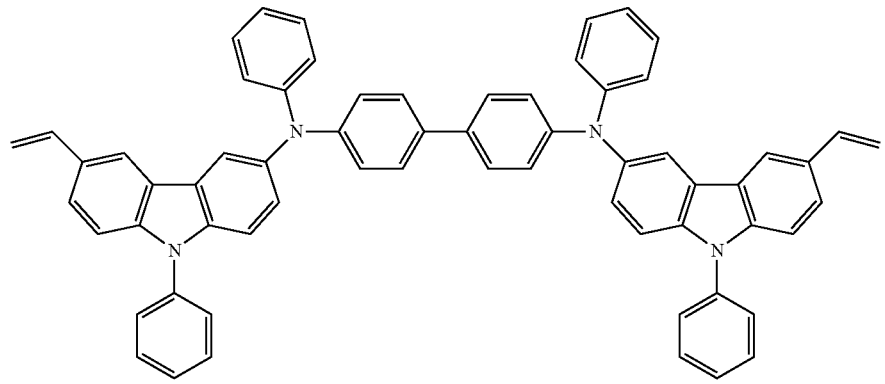
Chemical Formula 1-2
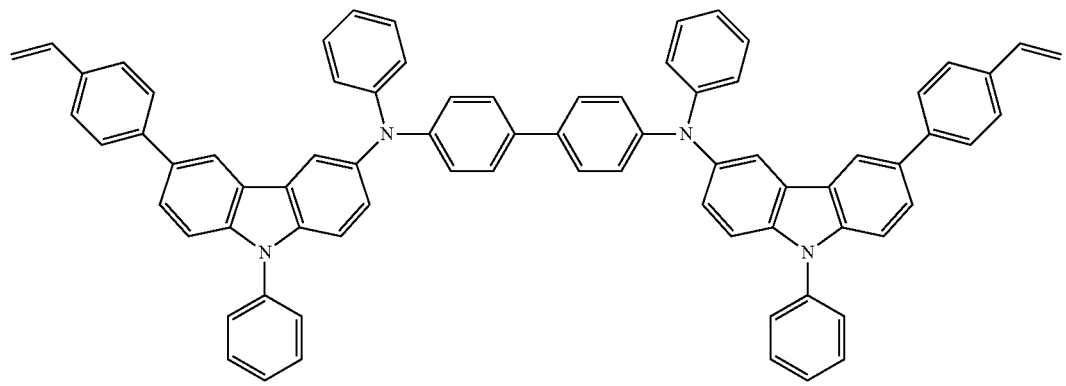
Chemical Formula 1-3
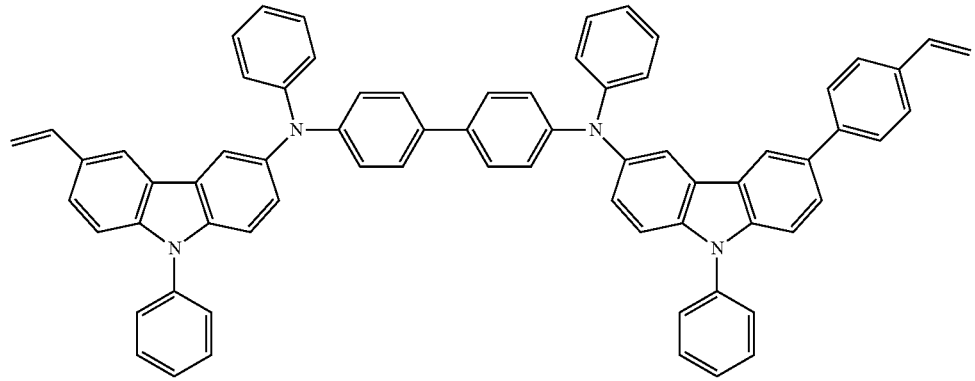

Chemical Formula 1-4
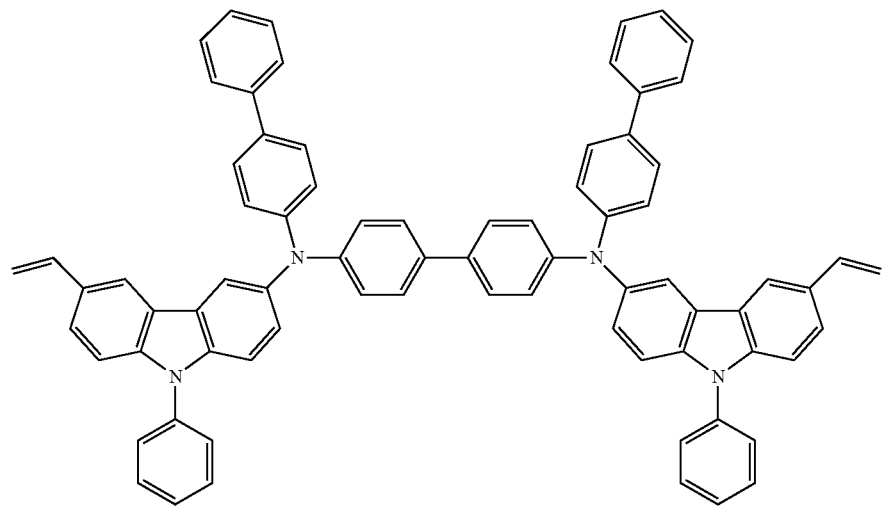
Chemical Formula 1-5
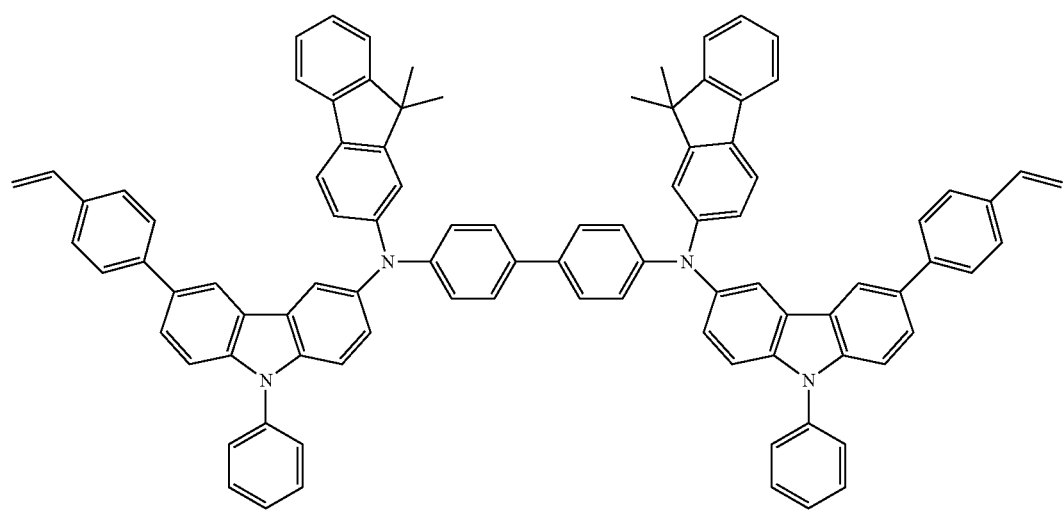
Chemical Formula 1-6
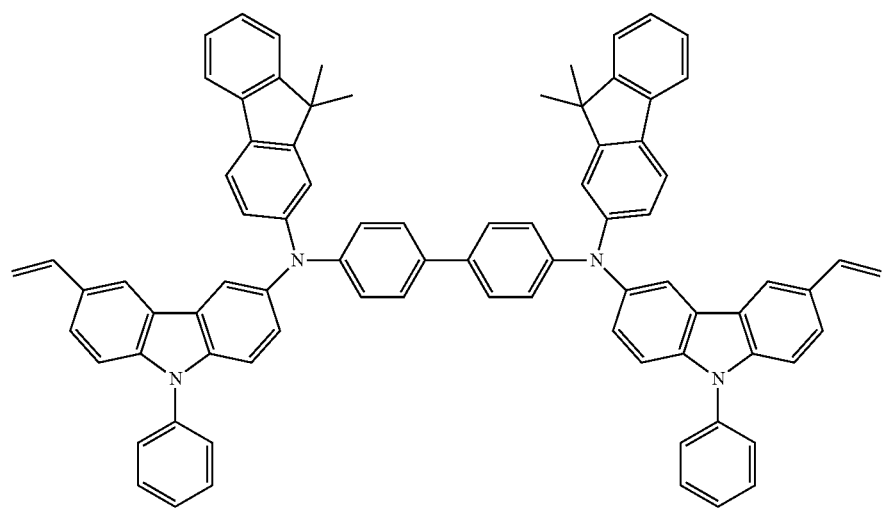

Chemical Formula 1-7
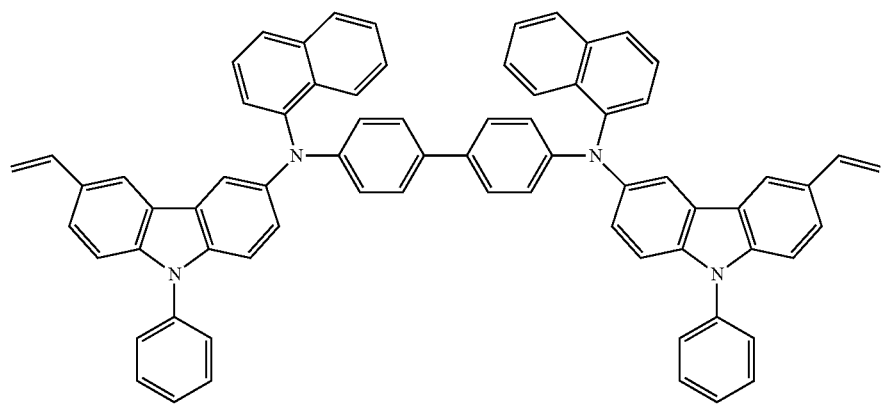
Chemical Formula 1-8
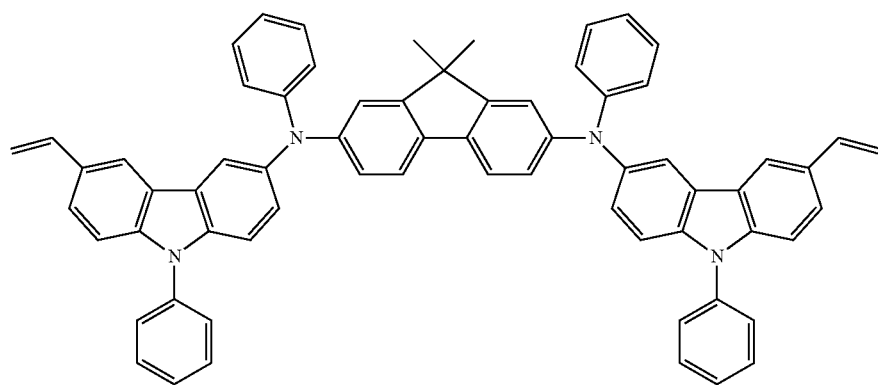
Chemical Formula 1-9
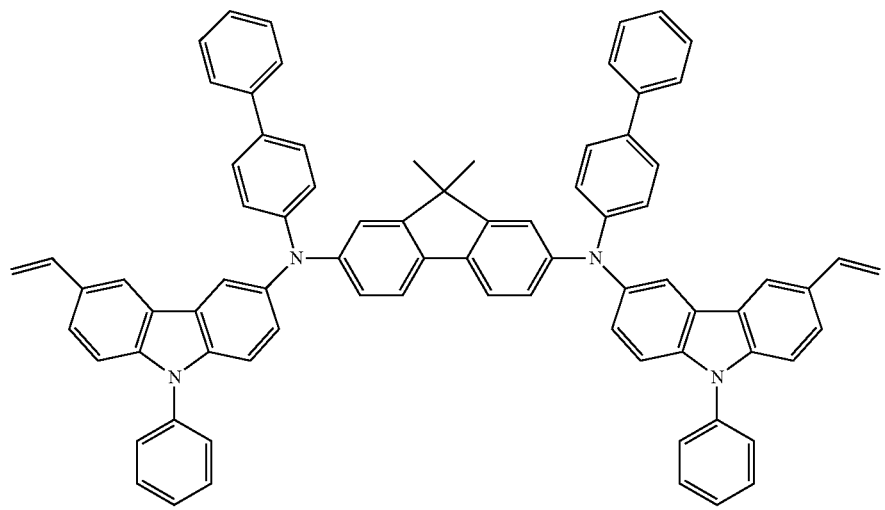

-continued
Chemical Formula 1-10
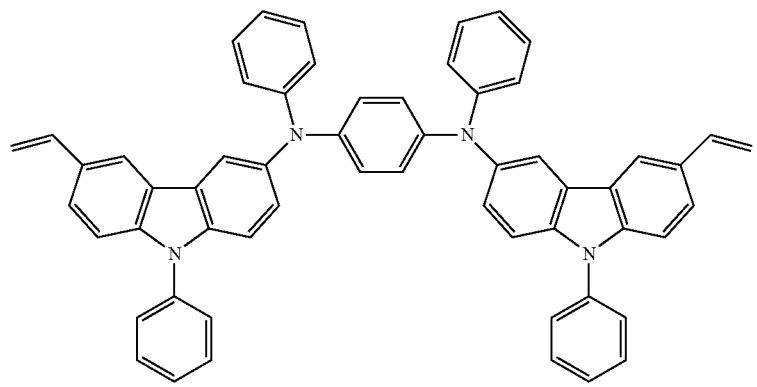
Chemical Formula 1-11
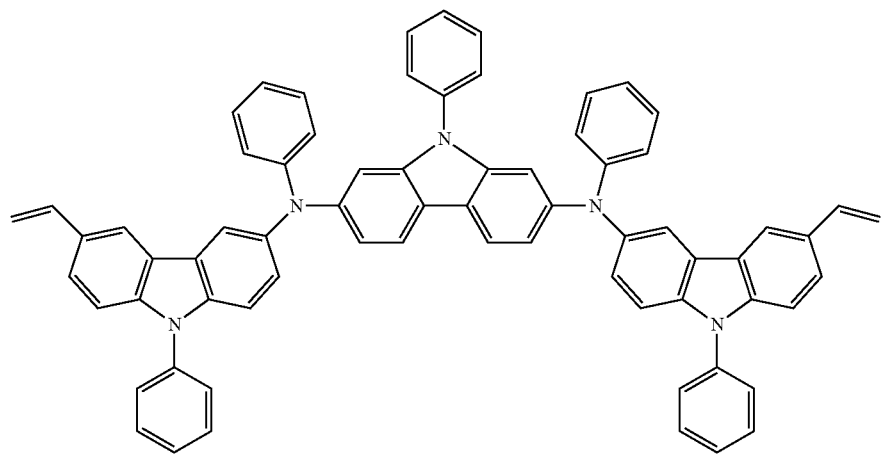
Chemical Formula 1-12
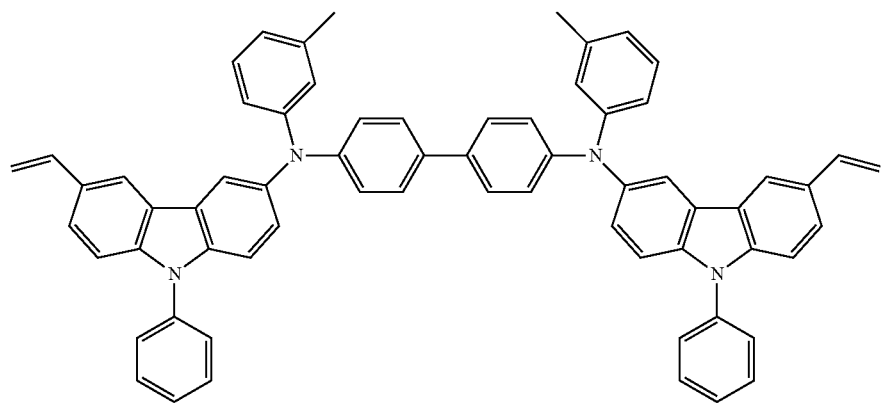
Chemical Formula 1-13
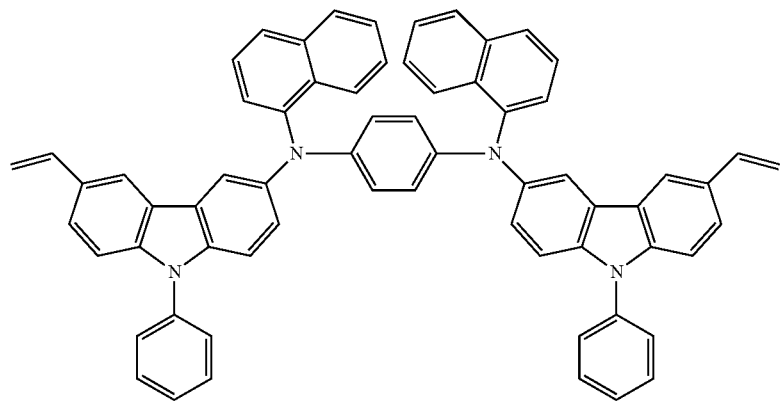

Chemical Formula 1-14
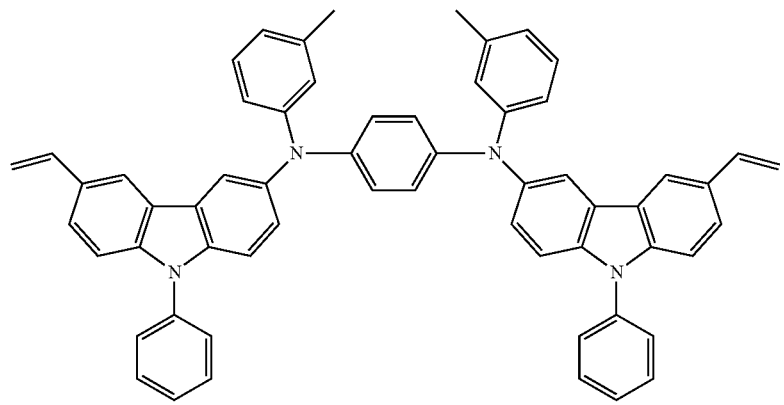
Chemical Formula 1-15
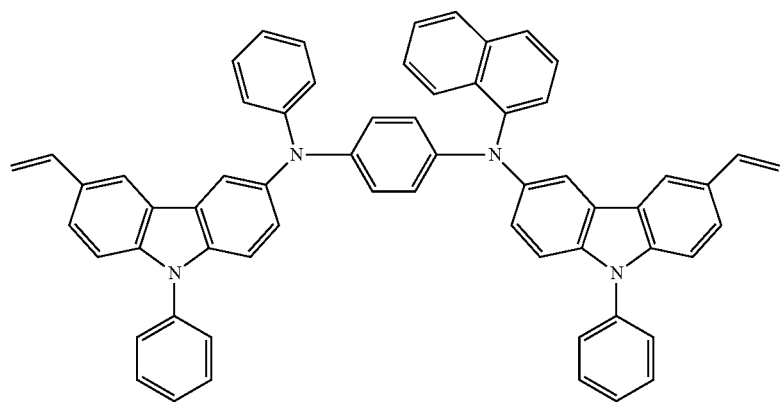
Chemical Formula 1-16
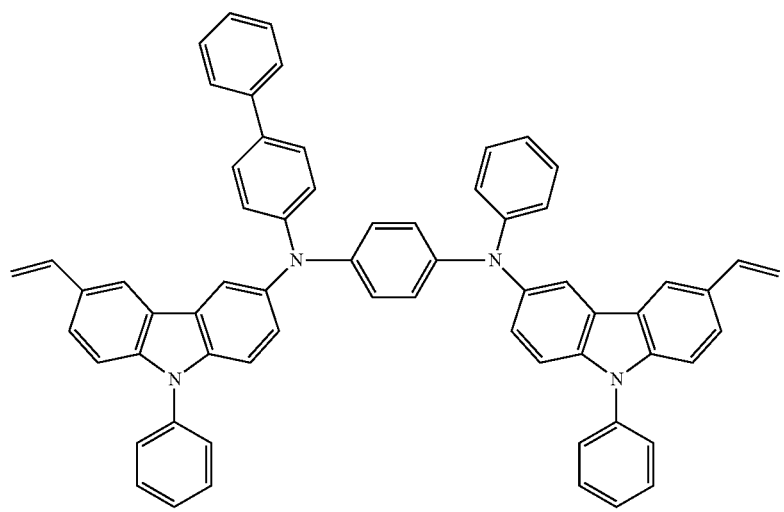

Chemical Formula 1-17
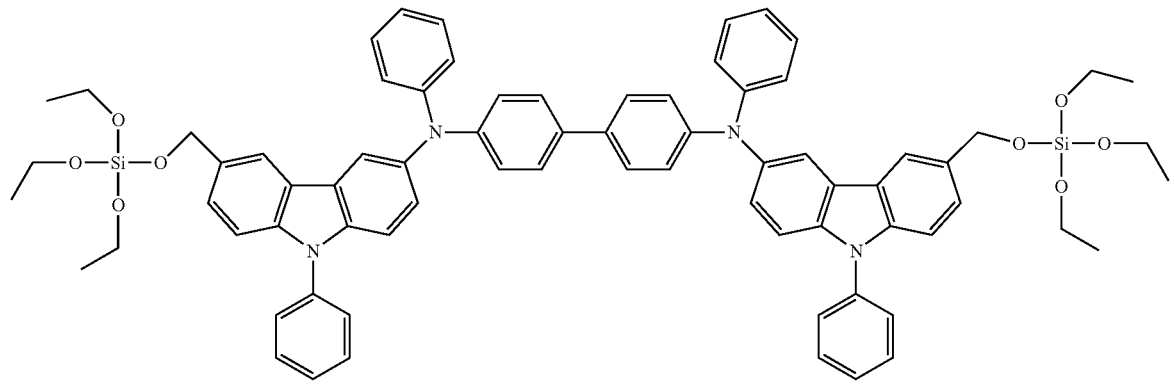
Chemical Formula 1-18
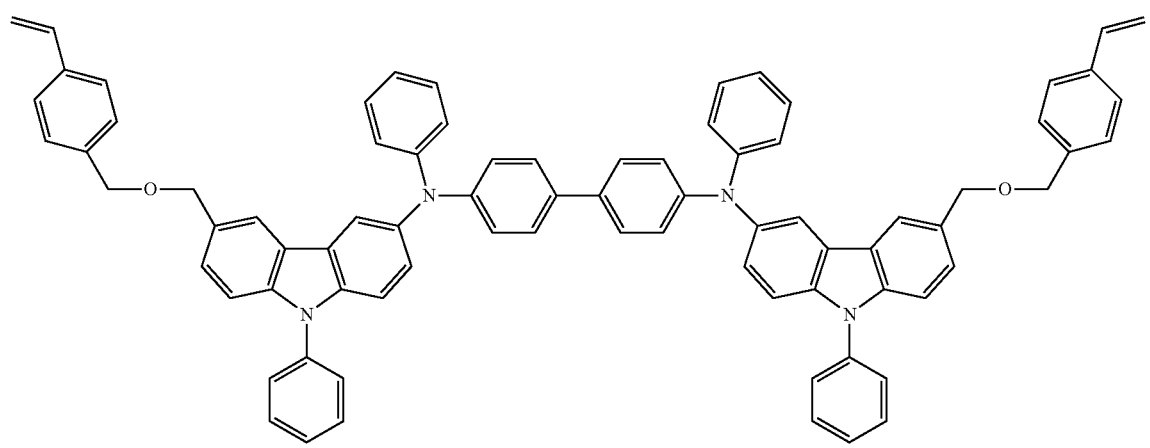
Chemical Formula 1-19
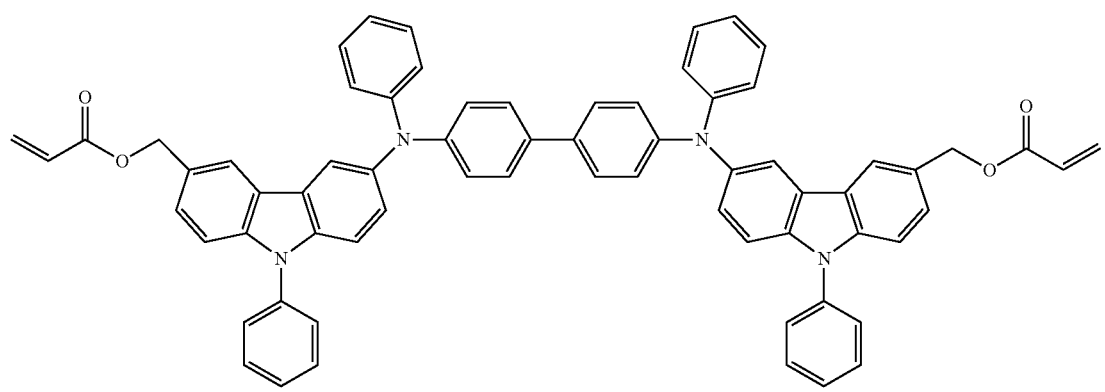
Chemical Formula 1-20
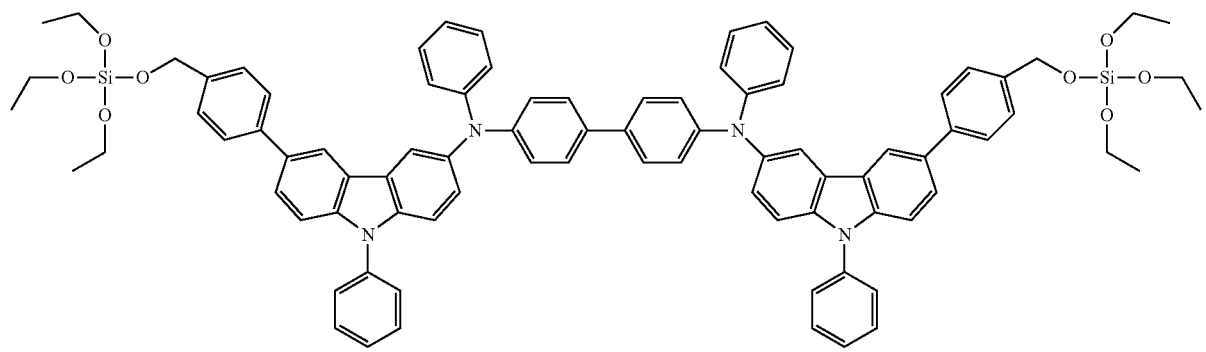

Chemical Formula 1-21
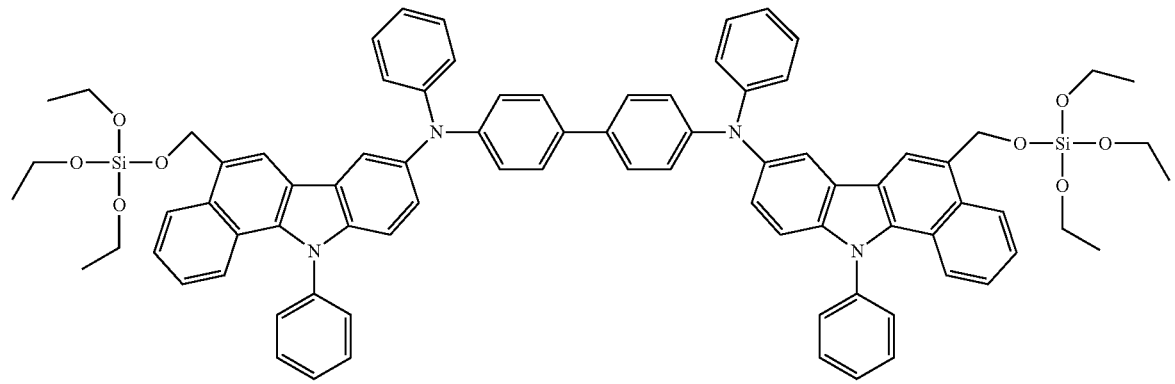
Chemical Formula 1-22
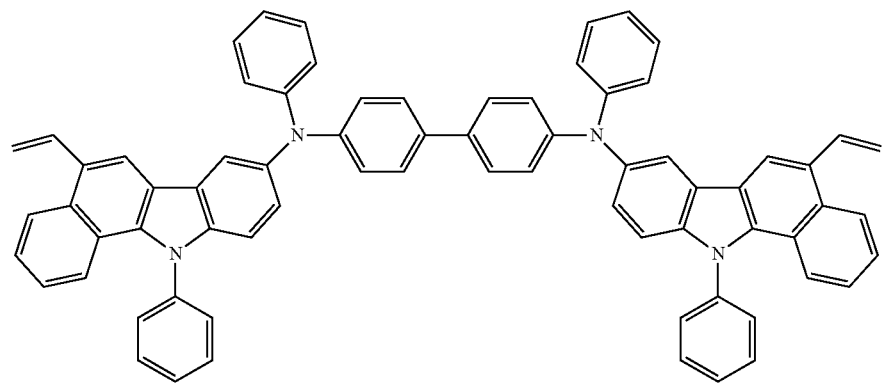
Chemical Formula 1-23
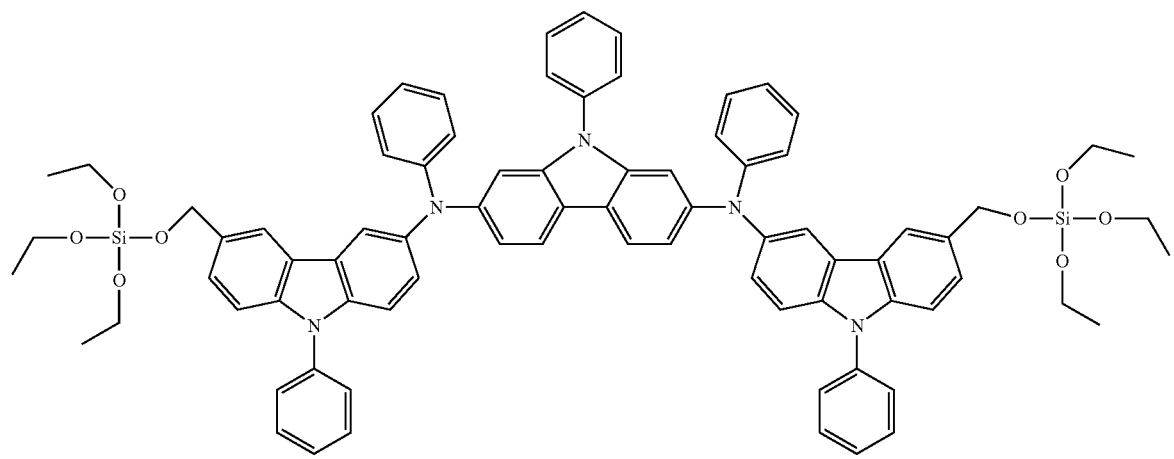

Chemical Formula 1-24
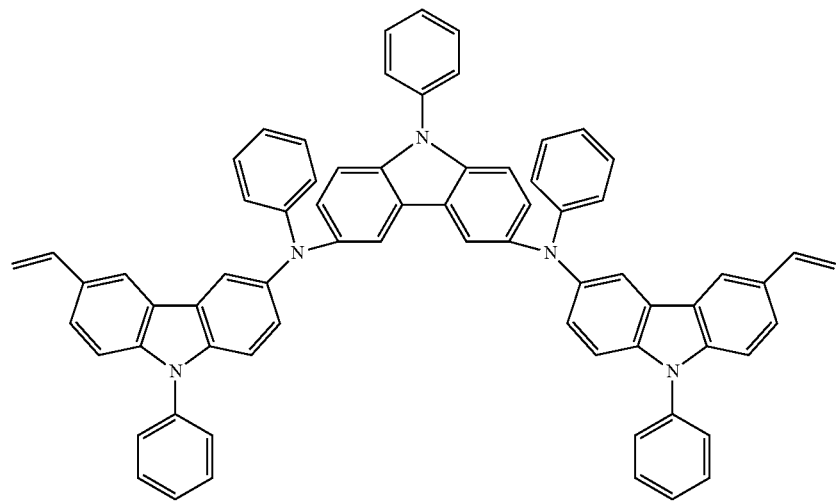
Chemical Formula 1-25
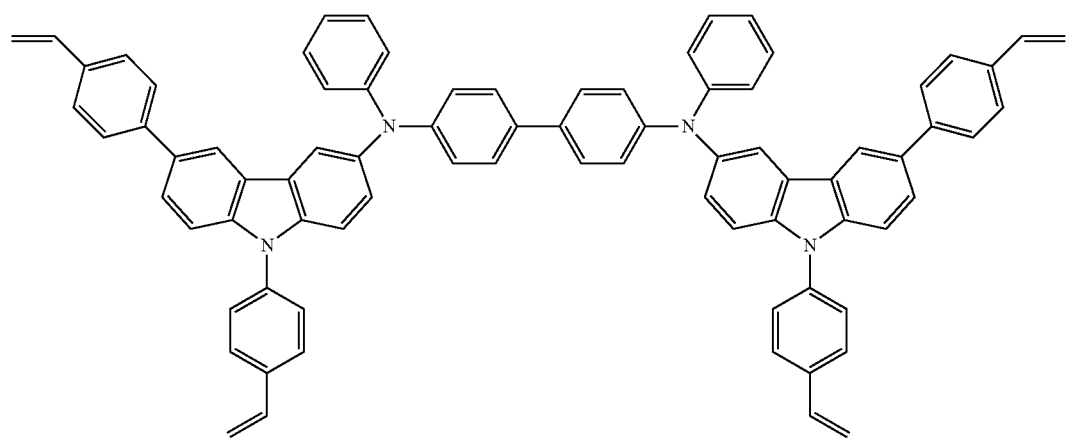
Chemical Formula 1-26
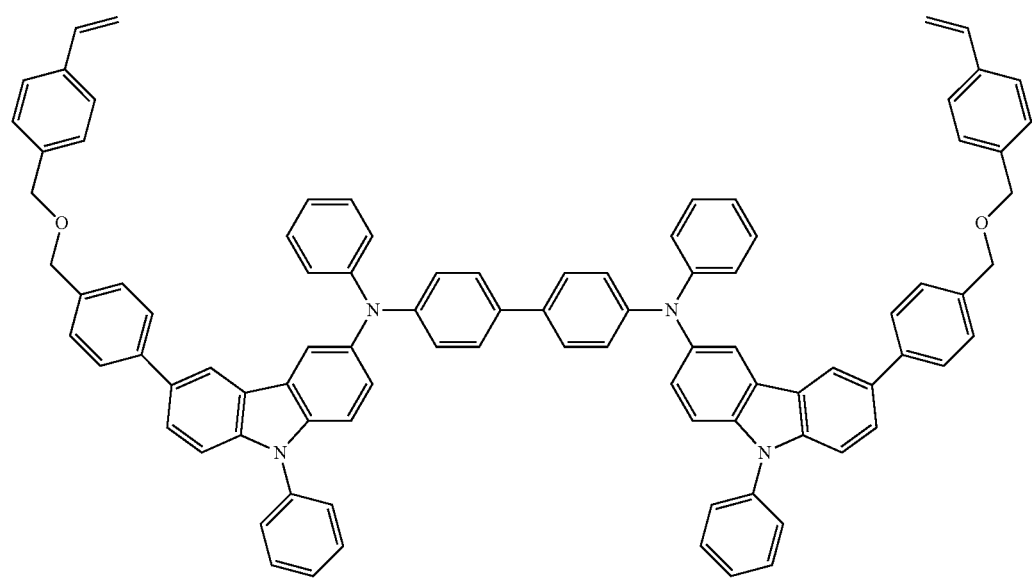

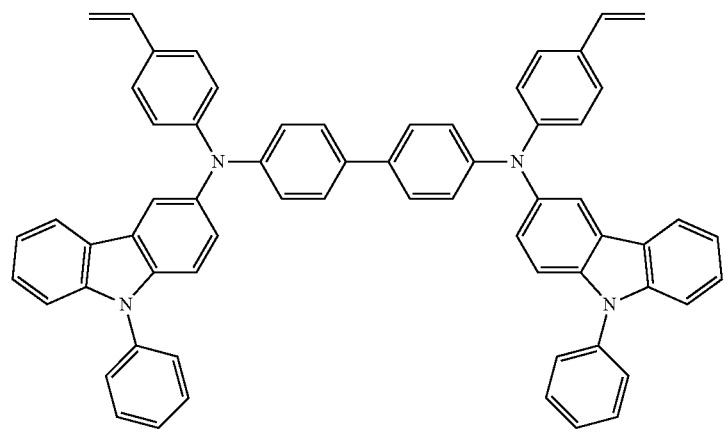
Chemical Formula 1-27
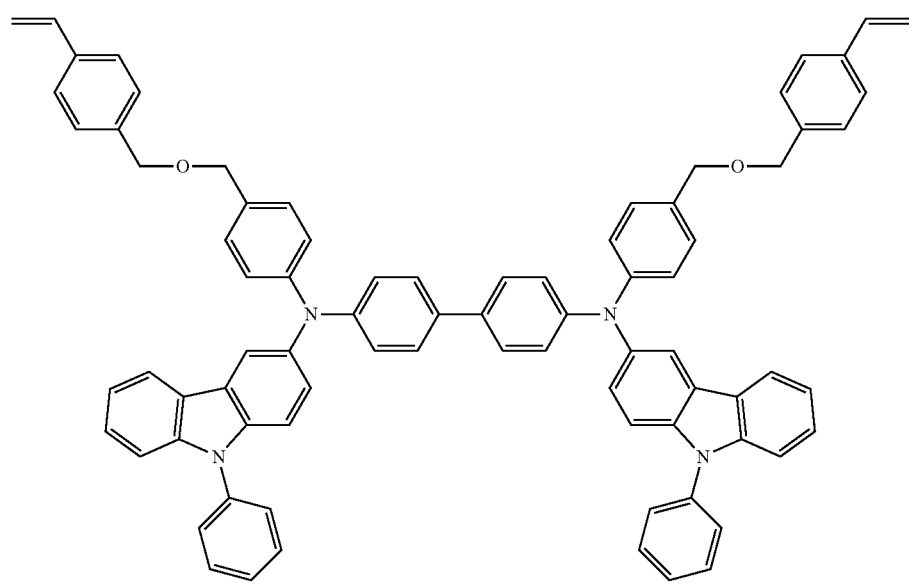
Chemical Formula 1-28
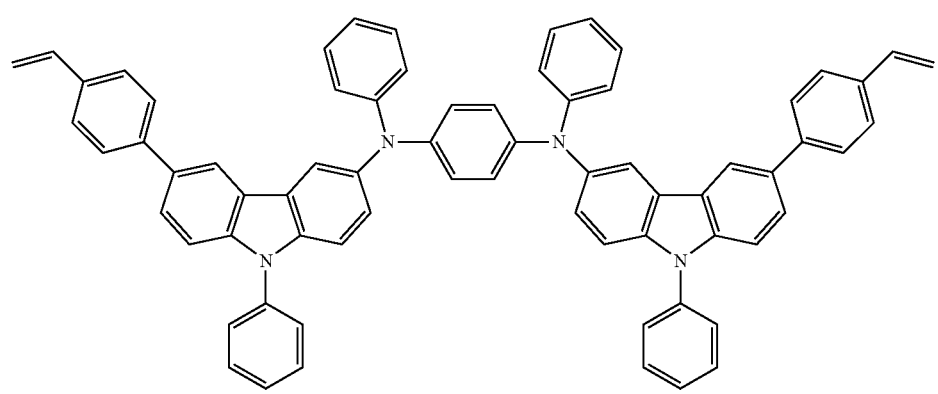
Chemical Formula 1-29

Chemical Formula 1-30
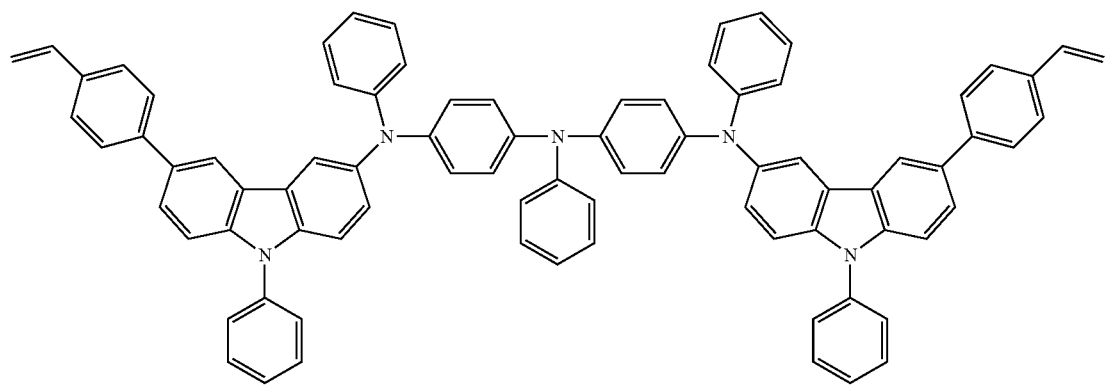
Chemical Formula 1-31
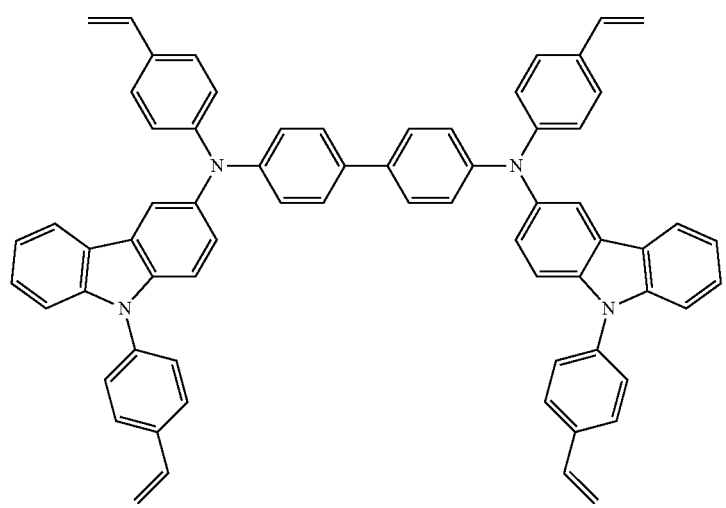
Chemical Formula 1-32
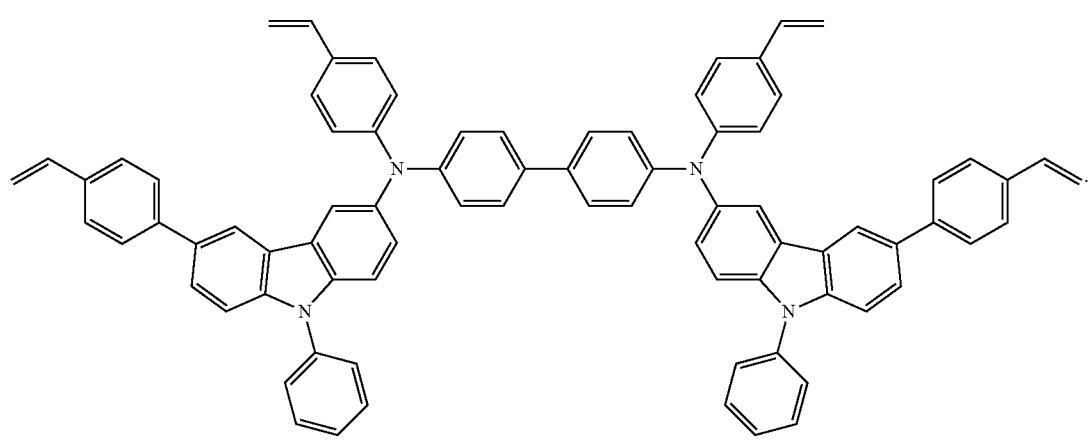

13. The ink composition of claim 6, wherein the charge transferring material or the light emitting material of the ink composition is included in 1 parts by weight to 10 parts by weight with respect to 100 parts by weight of the solvent.

* * * * *